US012592723B2

(12) United States Patent
Jian et al.

(10) Patent No.: US 12,592,723 B2
(45) Date of Patent: Mar. 31, 2026

(54) DUPLEXER, MULTIPLEXER AND MULTIBAND FILTER

(71) Applicant: Telefonaktiebolaget LM Ericsson (publ), Stockholm (SE)

(72) Inventors: Chunyun Jian, Ottawa (CA); Mi Zhou, Nepean (CA)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 485 days.

(21) Appl. No.: 18/014,690

(22) PCT Filed: Jul. 8, 2020

(86) PCT No.: PCT/IB2020/056432
§ 371 (c)(1),
(2) Date: Jan. 5, 2023

(87) PCT Pub. No.: WO2022/008957
PCT Pub. Date: Jan. 13, 2022

(65) Prior Publication Data
US 2023/0253988 A1    Aug. 10, 2023

(51) Int. Cl.
| | |
|---|---|
| *H04B 1/00* | (2006.01) |
| *H03H 7/46* | (2006.01) |
| *H03H 9/05* | (2006.01) |
| *H03H 9/72* | (2006.01) |
| *H04B 1/525* | (2015.01) |

(52) U.S. Cl.
CPC ........... *H04B 1/0057* (2013.01); *H03H 7/463* (2013.01); *H03H 9/0542* (2013.01); *H03H 9/725* (2013.01); *H04B 1/525* (2013.01)

(58) Field of Classification Search
CPC .... H01P 1/2138; H03H 7/463; H03H 9/0542; H03H 9/706; H03H 9/725; H04B 1/0057; H04B 1/525
See application file for complete search history.

(56) References Cited

U.S. PATENT DOCUMENTS

| | | | |
|---|---|---|---|
| 9,466,864 B2 | 10/2016 | Rogozine et al. | |
| 2006/0091977 A1 | 5/2006 | Inoue et al. | |
| 2011/0210787 A1 | 9/2011 | Lee et al. | |
| 2017/0070405 A1 | 3/2017 | Hashemi et al. | |
| 2019/0341945 A1* | 11/2019 | Mandegaran | H04B 1/48 |

FOREIGN PATENT DOCUMENTS

CN    101217267 B    2/2011

OTHER PUBLICATIONS

International Search Report and Written Opinion issued in International Application No. PCT/IB2020/056432 dated Mar. 10, 2021 (13 pages).

* cited by examiner

*Primary Examiner* — Nader Bolourchi
(74) *Attorney, Agent, or Firm* — Rothwell, Figg, Ernst & Manbeck, P.C.

(57) ABSTRACT
Methods and apparatuses are provided for a matched band pass filter utilized in a duplexer or multiplexer. In one embodiment, the matched band pass filter includes a filter part and a port-matching part that is coupled to and in signal communication with the filter part. The filter part is configured to filter an RF signal and includes an input port. The port-matching part includes an output port. The port-matching part is configured to provide impedance matching through the output port.

18 Claims, 40 Drawing Sheets

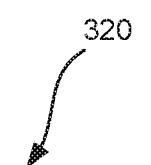
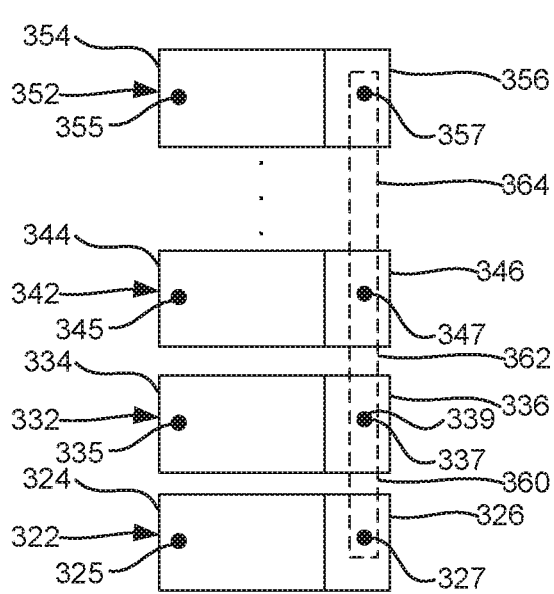
Figure 23

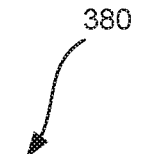
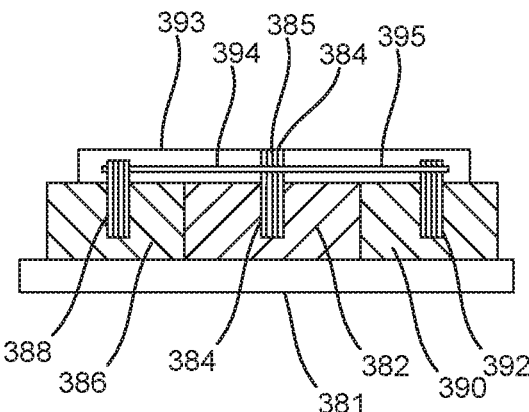
Figure 25

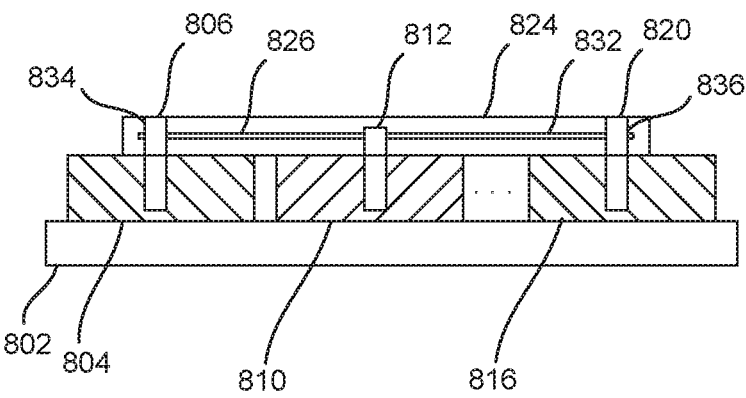
Figure 40

DUPLEXER, MULTIPLEXER AND MULTIBAND FILTER

CROSS REFERENCE TO RELATED APPLICATIONS

This application is a 35 U.S.C. § 371 National Stage of International Patent Application No. PCT/IB2020/056432, filed 2020 Jul. 8.

TECHNICAL FIELD

The present disclosure relates to wireless communications and, in particular, to duplexer, dual-band filter, multiplexer and multiband filter designs for radio communication systems.

BACKGROUND

Mixed filter technologies-based radio front-end for 4G and 5G Frequency Division Duplex (FDD) base station radios is considered very promising.

FIGS. 1 and 2 illustrate a typical prior art duplexer 10 based on use of two different filter technologies, namely, a Ceramic Wave Guide (CWG) TX filter 11 for a transmit (TX) path and monoblock RX filter 12 for a receive (RX) path. A transmission line 20 extends from a TX port of the duplexer 10 to a port 14 located on the TX filter 11. A transmission line 21 extends from a RX port of the duplexer 10 to a port 16 located on the RX filter 12.

As shown, in order to combine the two filters 11, 12, a carrier printed circuit board (PCB) 22 is needed. The transmissions 20, 21 are designed within the carrier PCB 22. Further, two transmission lines 17, 18, which are connected to ports 13, 15 respectively, are necessary for matching the ports 13, 15 of the two filters 11, 12 to form a joint port, namely the antenna (Ant) port 19 with a required impedance. The two transmission lines 17, 18 are usually designed within the carrier PCB 22 in quite long lengths. This results in the transmission lines 17, 18 being quite lossy due to the low Q feature of the PCB-based transmission line.

FIG. 3 illustrates a schematic representation of a prior art dual-band filter 40 which is based on two different filter technologies. In FIG. 3, dual-band filter 40 includes two single-band filters 50, 60, and four transmission lines 52, 54, 62, 64. Port 42 is a first input/output port of the dual-band filter 40, and is connected with a first port 56 of the filter 50 through the transmission line 52, also connected with a first port 66 of the filter 60 through the transmission line 62. Port 44 is a second input/output port of the dual-band filter 40, and is connected with a second port 58 of the filter 50 through the transmission line 54, also connected with a second port 68 of the filter 60 through the transmission line 64.

The filters 50, 60 also could be designed in the same filter technology.

Existing multiplexer design based on different filter technologies uses a very similar method to the duplexer design shown in FIGS. 1 and 2 to combine multiple single-band filters through transmission lines to form the Ant port.

In addition, multiband radio development is being strongly requested by many operators in current wireless industry, so high performance, small size and low-cost multiband filter design is highly demanded. Most of existing multiband filters are designed by using multiple single-band filters and adding transmission lines to each port of the filters to form a common input port and a common output port.

These transmission lines are for matching each port of the filters so that the matched ports can be combined to form the common input port and the common output port.

However, the existing duplexer and multiplexer design methods have disadvantages, as they introduce extra loss to the TX path on top of the already existed Tx filter loss, as well as have a large size. The extra loss is one generated by the transmission line 17 that is for matching the Tx filter port to the antenna port, as described for the duplexer above in FIG. 1. As the Tx path loss of the radio front-end is required to be a very low-level in many radio design specifications, it is difficult to meet the Tx path loss requirement if the existing design method for the duplexer or multiplexer design is used. The large size is due to the use of carrier PCB and two long transmission lines.

For traditional single filter technology-based integrated types of dual-band and multiband filter designs, the biggest challenge with the existing design methods is their manufacture, because their filter tuning is much more difficult than any single-band filter tuning. As result, the dual-band and multiband filters always have a high cost feature.

For the different filter technologies-based dual-band and multiband filter designs mentioned above, the existing design method shown in FIG. 3 also have the same loss disadvantages as the multiplexer mentioned above, due to the same reason that it uses a lot of PCB-based transmission lines that cause an extra loss.

Therefore, the wireless industry is looking for an innovative design solution for both designs of the multiplexer including duplexer and multiband filter including dual-band filter.

SUMMARY

Some embodiments of the present disclosure advantageously provide methods, apparatuses and systems related to duplexer, multiplexer and multiband filter designs.

According to one aspect of the present disclosure, a single-port-matched band pass filter (SPMBPF) is provided. The SPMBPF includes a main part and a port-matching part coupled to and in signal communication with the main part. The main part is configured to filter an RF signal and including a first port which is configured to transmit or receive the RF signal. The port-matching part including a second port that is configured to be connected to at least two RF components and is configured to provide impedance matching through the second port relative to at least one of the at least two RF components. In some aspects, the impedance matching can be further defined as a relatively high impedance in a specified frequency range of out-of-passband of the SPMBPF to match at least one of the at least two RF components connected thereon. In some aspects, the port-matching part and main part can be constructed together using the same materials and manufacture process.

According to another aspect of the present disclosure, a duplexer is provided. The duplexer includes a TX matched band pass filter and a RX matched band pass filter. The TX matched band pass filter includes a TX filter part and a TX port-matching part coupled to and in signal communication with the TX filter part. The TX filter part is configured to filter a transmit RF signal and includes a TX input port. The TX port-matching part includes an TX path output port and is configured to provide impedance matching, which can be a relatively high impedance, in RX band through the TX path output port. The TX path output port is connected to an antenna port of the duplexer. The RX matched band pass filter includes a RX filter part and a RX port-matching part coupled to and in signal communication with the RX filter part. The RX filter part is configured to filter a received RF signal. The RX filter part includes a RX output port. The RX port-matching part includes an RX path input port and is configured to provide impedance matching, which can be a relatively high impedance, in TX band through the RX path input port. The RX path input port is connected to a RF transmission line component which is connected to the antenna port.

The duplexer includes a transmit single-port-matched band pass filter (TX SPMBPF) and a receive single-port-matched band pass filter (RX SPMBPF). The TX SMBPF includes a TX main part and a TX port-matching part coupled to and in signal communication with the TX main part. The TX main part is configured to filter a transmit RF signal and includes a TX first port in signal communication with a transmit port. The TX first port is configured to receive the transmit RF signal from the transmit port. The TX port-matching part includes a TX second port that is configured as an antenna port and in signal communication with an antenna.

A RF transmission line component is connected to the TX second port. In some aspects, the RF transmission line component is located within a substrate such as a LTCC, a PCB or within a carrier PCB.

The RX SPMBPF includes a RX main part and a RX port-matching part coupled to and in signal communication with the RX main part. The RX main part includes a RX first port that is in signal communication with a receive port and is configured to filter a received RF signal and provide the filtered received RF signal to the receive port through the RX first port. The RX port-matching part includes an RX second port that is connected to the RF transmission line component providing signal communication to the antenna port.

In these aspects, the TX port-matching part is configured to provide impedance matching in its RX band to match the connected RX SPMBPF and the antenna at the antenna port. Further, the RX port-matching part is configured to provide impedance matching in its TX band to match the connected TX SPMBPF and the antenna at the antenna port.

In some aspects, the impedance matching provided by the TX port-matching part is further defined as a relatively high impedance in the RX band of the TX SPMBPF.

Further, in some aspects, the impedance matching provided by the RX port-matching part is further defined as a relatively high impedance in the TX band of the RX SPMBPF.

In some aspects, the TX port-matching part and TX main part and/or RX port-matching part and RX main part are constructed together using the same materials and manufacture process.

In some aspects, the RX SPMBPF is attached adjacent to the TX SPMBPF in a stacked configuration such that the TX second port and RX second port are aligned.

According to another aspect of the present disclosure, a multiplexer is provided. A multiplexer includes one or more transmit single-port-matched band pass filters (TX SPMBPFs) and one or more receive single-port-matched band pass filters (RX SPMBPFs) connected to the TX SPMBPFs by a plurality of RF transmission line components.

Each TX SPMBPF includes a TX main part and a TX port-matching part, the TX port-matching part coupled to and in signal communication with the TX main part. The TX main part including a TX first port in signal communication with a transmit port and is configured to receive a transmit RF signal from the transmit port. The TX main part is configured to filter the transmit RF signal. The TX port-matching part includes a TX second port being configured in signal communication with an antenna where one of the TX second ports of the one or more TX SPMBPFs being configured as an antenna port.

The plurality of RF transmission line components are connected to the TX second ports of the one or more TX SPMBPFs.

Each RX SPMBPF includes a RX main part and a RX port-matching part coupled to and in signal communication with the RX main part. The RX main part includes a RX first port in signal communication with a receive port. The RX port-matching part including an RX second port connected to at least one of the plurality of RF transmission line components and provides signal communication to the antenna port. The RX port-matching part is configured to receive a RF signal from the antenna port.

The RX main part is configured to filter the received RF signal and provide the filtered received RF signal to the receive port through the RX first port. The RX port-matching part is configured to provide impedance matching in all pass bands of its connected TX SPMBPFs and other RX SPMBPFs to match all the connected TX and other RX SPMBPFs and the antenna at the antenna port, Further, each of the TX port-matching parts configured to provide impedance matching in all pass bands of its connected other TX SPMBPFs and RX SPMBPFs to match all the connected other TX SPMBPFs and RX SPMBPFs and the antenna at the antenna port.

In some aspects, the impedance matching provided by each of the TX port-matching parts is further defined as a relatively high impedance in all pass bands of its connected other TX SPMBPFs and RX SPMBPFs for its own TX SPMBPF. In some additional aspects, the impedance matching provided by each of the RX port-matching parts is further defined as a relatively high impedance in all pass bands of its connected TX SPMBPFs and other RX SPMBPFs for its own RX SPMBPF.

In some aspects, each of the TX port-matching parts and TX main parts and/or the RX port-matching parts and RX main parts are constructed using the same materials and manufacture process.

In some aspects, the one or more RX SPMBPFs are attached adjacent to the one or more TX SPMBPFs in a stacked configuration. In some additional aspects, the one or more RX SPMBPFs are attached adjacent to the one or more TX SPMBPFs in a stacked configuration where the TX second ports and the RX second ports are aligned.

In some aspects, the one or more TX SPMBPFs are attached adjacent to the one or more RX SPMBPFs in a side-to-side configuration. In some additional aspects, the one or more TX SPMBPFs and the one or more the RX SPMBPFs are attached in a side-to-side configuration where the TX second ports and the RX second ports are aligned.

According to another aspect of the present disclosure, a dual-port-matched band pass filter (DPMBPF) is disclosed. The DPMBPF includes a filter main part, a first port-matching part coupled to and in signal communication with the filter main part and a second port-matching part coupled to and in signal communication with the filter main part. The filter main part configured to filter an RF signal. The first port-matching part includes a first port configured to be connected to first ports of one or more other DPMBPFs and is configured to transmit or receive the RF signal. The first port-matching part is configured to provide impedance matching through the first port to match the ports of the connected other DPMBPFs. The second port-matching part includes a second port that is configured to be connected to one or more second ports of the other DPMBPFs and is configured to transmit or receive the RF signal. The second port-matching part is configured to provide impedance matching through the second port to match the second port of the connected other DPMBPFs.

In some aspects, the impedance matching provided by the first port-matching part is further defined as a relatively high impedance in a specified frequency range to match the ports of the connected other DPMBPFs. In some additional aspects, the impedance matching provided by the second port-matching part is further defined as a relatively high impedance in the same specified frequency range to match the one or more second ports of the connected other DPMBPFs.

In some aspects, the filter main part, first port-matching part and second port-matching part are constructed using the same materials and manufacture process.

According to another aspect of the present disclosure, a dual-band pass filter is provided. The dual-band pass filter includes a first dual-port-matched band pass filter (DPMBPF) and a second DPMBPF. Each of the first and second DPMBPF having a filter main part configured to filter RF signals, a first port-matching part coupled in signal communication with the filter main part and a second port-matching part coupled in signal communication with the filter main part. The first port-matching part having a first port configured to be connected to another first port of the other DPMBPF, where one of the two first ports is config- ured as a common input/output port. The second port- matching part includes a second port that is configured to be connected to the second port of the other DPMBPF where one of the two second ports is configured as another input/ output common port.

In some aspects, the first port-matching part is configured to provide impedance matching through the first port to match the first ports of the connected other DPMBPFs. The second port-matching part includes a second port that is configured to be connected to second ports of the other DPMBPFs and is configured to transmit or receive the RF signal. The second port-matching part is configured to provide impedance matching through the second port to match the second ports of the connected other DPMBPFs. In some further aspects, the impedance matching provided by the each of the first port-matching parts is further defined as a relatively high impedance in passband of another DPMBPF, and the impedance matching provided by the each of the second port-matching parts is further defined as a relatively high impedance also in passband of another DPMBPF.

In some aspects, one or more transmission lines connect the first ports of the first and second DPMBPFs providing signal communication between the first ports. In some additional aspects, one or more transmission lines connect the second ports of the first and second DPMBPFs providing signal communication between the second ports.

In some aspects, the filter main part, first port-matching part and second port-matching part of one or both of the two DPMBPFs are constructed using the same materials and manufacture process.

In some aspects, the first DPMBPF is attached adjacent to the second DPMBPF in a side-by-side configuration.

In some aspects, the first DPMBPF is attached adjacent to the second DPMBPF in a stacked configuration where the two first ports and the two second ports of the two DPMBPFs are aligned.

In some aspects, the one or more of the transmission line components are located within a substrate.

According to another aspect of the present disclosure, a multi-band pass filter is provided. The multi-band pass filter includes a plurality dual-port-matched band pass filters (DPMBPFs). Each of the plurality of DPMBPFs includes a filter main part configured to filter RF signals, a first port-matching part coupled in signal communication with the filter main part and a second port-matching part coupled in signal communication with the filter main part. The first port-matching part having a first port configured to be connected to another first port of the one or more of the remaining plurality of DPMBPFs, where at least one of the first ports is configured as a common input/output port. In some aspects, the first port-matching part is configured to provide impedance matching through the first port to match the first ports of the connected other DPMBPFs. The second port-matching part includes a second port that is configured to be connected to at least one of the second ports of the remaining plurality of DPMBPFs where at least one of the two second ports is configured as another input/output common port. The second port-matching part is configured to provide impedance matching through the second port to match the second ports of the connected other DPMBPFs. In some further aspects, the impedance matching provided by the each of the first port-matching parts is further defined as a relatively high impedance in passband of another DPMBPF, and the impedance matching provided by the each of the second port-matching parts is further defined as a relatively high impedance also in passband of another DPMBPF.

In some aspects, one or more transmission lines connect the first ports of two or more DPMBPFs providing signal communication between the first ports. In some further aspects, one or more transmission lines connect the second ports of the two or more DPMBPFs providing signal com- munication between the second ports.

In some aspects, the impedance matching provided by the each of the first port-matching parts is further defined as a relatively high impedance in all passbands of the remaining DPMBPFs, and the impedance matching provided by the each of the second port-matching parts is further defined as a relatively high impedance also in all passbands of the remaining DPMBPFs.

In some aspects, the filter main part, first port-matching part and second port-matching part of one of the plurality of DPMBPFs are constructed using the same materials and manufacture process.

In some aspects, the DPMBPFs are attached adjacent to each other in a side-by-side configuration.

In some aspects, the DPMBPFs are attached adjacent to each other in a stacked configuration where all the first ports and the second ports of the plurality of DPMBPFs are aligned, respectively.

In some aspects, one or more of the transmission line components are located within a substrate.

BRIEF DESCRIPTION OF THE DRAWINGS

A more complete understanding of the present embodi- ments, and the attendant advantages and features thereof, will be more readily understood by reference to the follow- ing detailed description when considered in conjunction with the accompanying drawings wherein:

FIG. 23 is a schematic block diagram of an embodiment of a single-port-matched band pass filter-based multiplexer of the present invention.

FIG. 25 is a side section view of a schematic block diagram of additional embodiment of a single-port-matched band pass filter-based multiplexer of FIG. 24.

FIG. 40 is a side section view of a schematic block diagram of additional embodiment of a dual-port-matched band pass filter-based multiband filter of FIG. 39.

DETAILED DESCRIPTION

Figure 1:
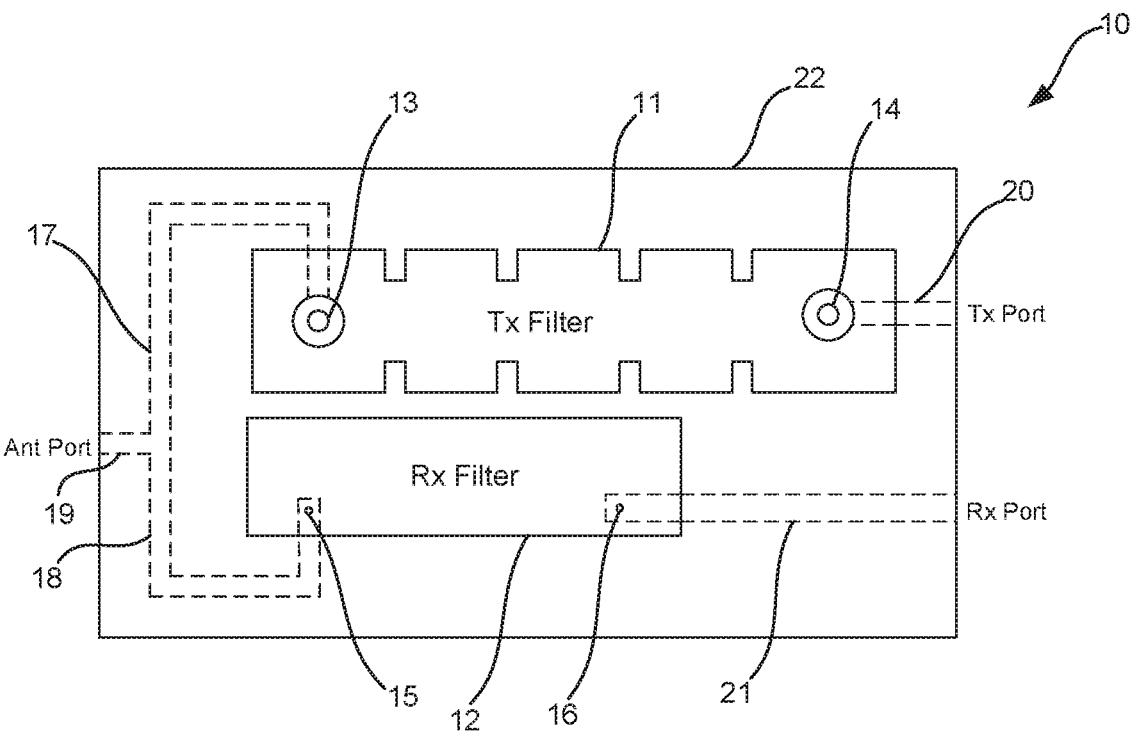
FIG. 1 is a top view of a schematic block diagram of a prior art duplexer.
Figure 2:
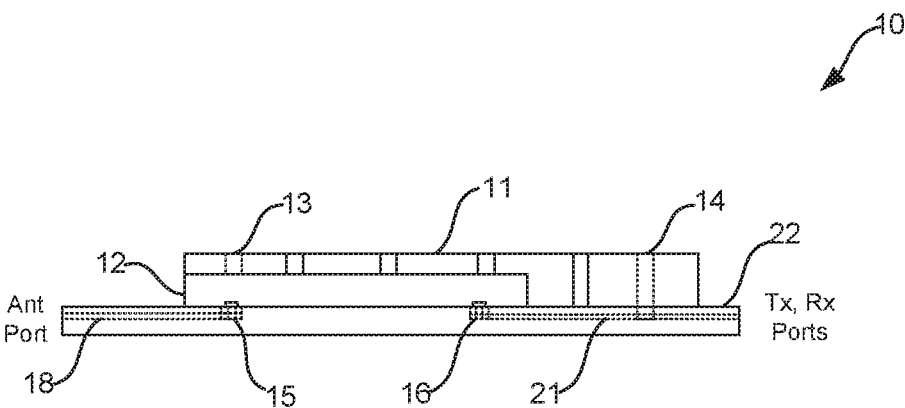
FIG. 2 is a side view of a schematic block diagram of the prior art duplexer of FIG. 1.
Figure 3:
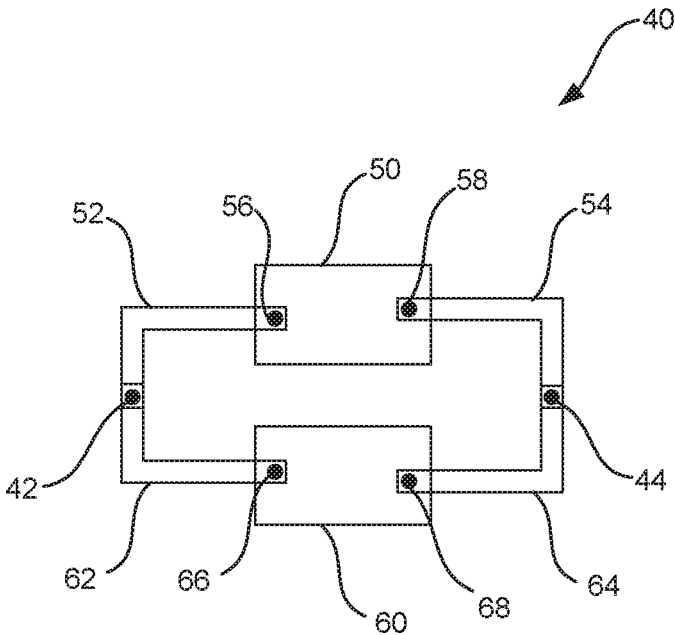
FIG. 3 is a schematic block diagram of a prior art dual-band filter.

Referring now to the drawing figures in which like reference designators refer to like elements, some embodiments of the present disclosure.

Before describing in detail exemplary embodiments, it is noted that the embodiments reside primarily in combinations of apparatus components and processing steps related to band pass filter, duplexer, multiplexer and multiband filter designs. Accordingly, components have been represented where appropriate by conventional symbols in the drawings, showing only those specific details that are pertinent to understanding the embodiments so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements. The terminology used herein is for the purpose of describing particular embodiments only and is not intended to be limiting of the concepts described herein. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

In embodiments described herein, the joining term, "in communication with" and the like, may be used to indicate electrical or data communication, which may be accomplished by physical contact, induction, electromagnetic radiation, radio signaling, infrared signaling or optical signaling, for example. One having ordinary skill in the art will appreciate that multiple components may interoperate, and modifications and variations are possible of achieving the electrical and data communication.

In some embodiments described herein, the term "coupled," "connected," and the like, may be used herein to indicate a connection, although not necessarily directly, and may include wired and/or wireless connections.

The band pass filter, duplexer, multiplexer and multiband filter designs discussed herein may be any band pass filter design such as, for example, a band pass filter design in a network node comprised in a radio network which may further be comprised in and/or connected to any of base station (BS), radio base station, base transceiver station (BTS), base station controller (BSC), radio network controller (RNC), e Node B (eNB), evolved Node B (eNB or eNodeB), Node B, multi-standard radio (MSR) radio node such as MSR BS, multi-cell/multicast coordination entity (MCE), integrated access and backhaul (IAB) node, relay node, donor node controlling relay, radio access point (AP), transmission points, transmission nodes, Remote Radio Unit (RRU), Remote Radio Head (RRH), baseband unit (BBU), a core network node (e.g., mobile management entity (MME), self-organizing network (SON) node, a coordinating node, positioning node, MDT node, etc.), an external node (e.g., 3rd party node, a node external to the current network), nodes in distributed antenna system (DAS), a spectrum access system (SAS) node, an element management system (EMS), etc. The network node may also comprise test equipment. The term "radio node" used herein may be used to also denote a wireless device (WD) such as a user equipment (UE) or a radio network node.

Note that although terminology from one particular wireless system, such as, for example, Third Generation Partnership Project (3GPP) Long Term Evolution (LTE) and/or New Radio (NR), may be used in this disclosure, this should not be seen as limiting the scope of the disclosure to only the aforementioned system. Other wireless systems, including without limitation Wide Band Code Division Multiple Access (WCDMA), Worldwide Interoperability for Microwave Access (WiMax), Ultra Mobile Broadband (UMB) and Global System for Mobile Communications (GSM), may also benefit from exploiting the ideas covered within this disclosure.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

First Embodiment Single-Port-Matched Band Pass Filter (SPMBPF)

Figure 4:
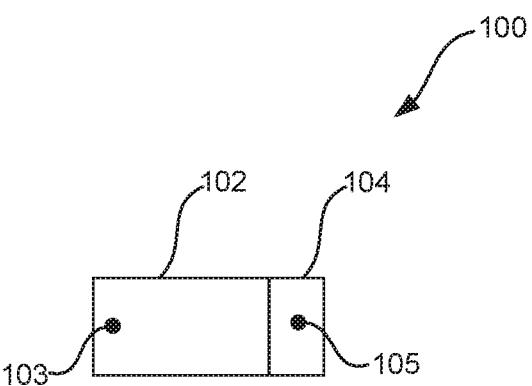
FIG. 4 is a schematic block diagram of an embodiment of single-port-matched band pass filter of the present invention.

In general, the embodiments of the present invention include one or more inventive single-port-matched band pass filters as described herein. FIG. 4 illustrates an embodiment of a single-port-matched band pass filter (SPMBPF) 100. SPMBPF 100 is configured to filter an RF signal and to be connected to at least two RF components while providing impedance matching relative to these RF components and includes a main part 102 and a port-matching part 104.

Main part 102 is configured to mainly filter the RF signal. Further, main part 102 includes, or otherwise forms, a first port 103 that provides the capability to transmit or receive the RF signal which will be filtered by main part 102.

In these embodiments, port-matching part 104 is designed together with main part 102 using same materials and manufacture process, and is in signal communication with main part 102, i.e. the RF signal may transfer between the main part 102 and the port-matching part 104. Port-matching part 104 includes, or otherwise forms, a second port 105 that is configured to be connected to at least two RF components. The RF components may be an additional SPMBPF, antenna or another RF component. Port-matching part 104 is further configured to provide impedance matching through the second port 105 to match the connected at least two RF components. In some embodiments, the impedance matching may be defined as a relatively high impedance in a specified frequency range of out of passband of the SPMBPF 100 to match the connected RF components.

Figure 5:
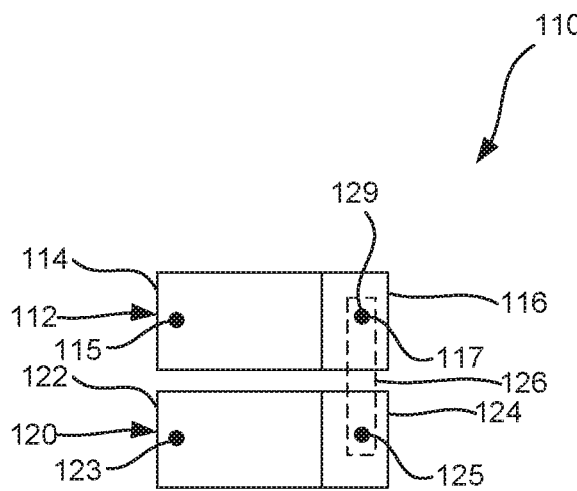
FIG. 5 is a schematic block diagram of an embodiment of a single-port-matched band pass filter-based duplexer of the present invention.
Figure 6:
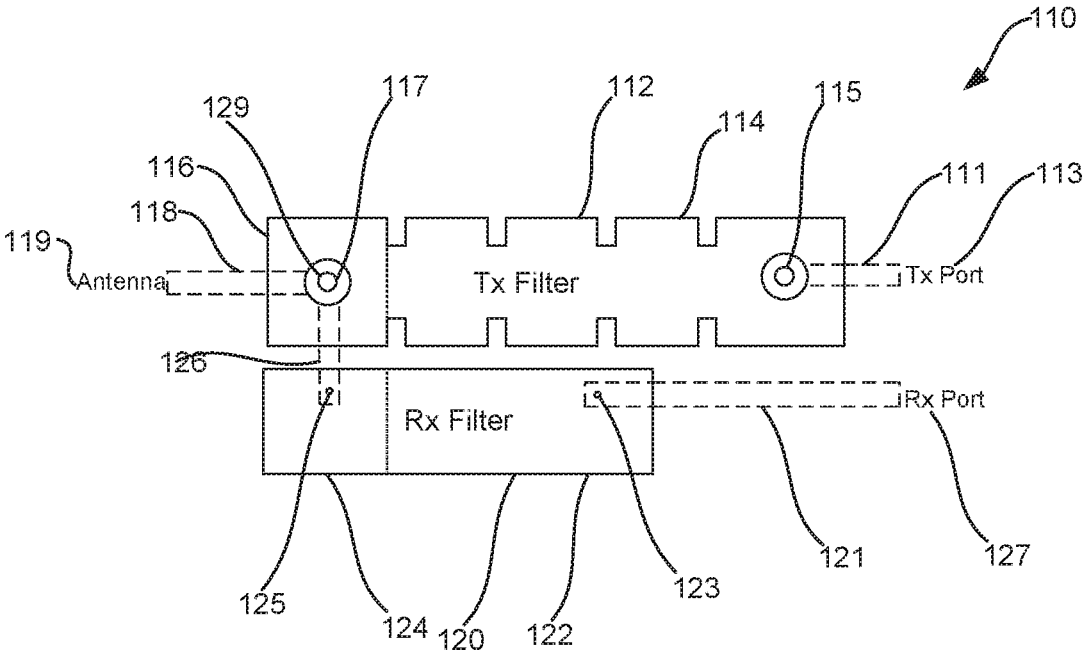
FIG. 6 is a schematic block diagram of an embodiment of a single-port-matched band pass filter-based duplexer of the present invention.

As illustrated in FIGS. 5 and 6, an embodiment of a duplexer 110 utilizing the SPMPBF is illustrated. Duplexer 110 includes a transmit single-port-match band pass filter (TX SPMBPF or TX filter) 112 and a receive single-port-matched band pass filter (RX SPMBPF or Rx filter) 120. A short transmission line 126 extends between TX SPMBPF 112 and RX SPMBPF 120.

TX SPMBPF 112 includes a TX main part 114 having TX first port 115 (otherwise referred to as TX input port) of the TX SPMBPF 112 that is connected to a transmit port (TX port) 113 of the duplexer 110 by a transmission line 111. The TX main part 114 is configured to mainly filter a transmit RF signal provided through the TX first port 115. TX SPMBPF 112 further includes a TX port-matching part 116 having a TX second port 117 (otherwise referred to as TX path output port). The TX second port 117 is used as antenna port 129 of the duplexer 110.

Since the antenna port 129 is connected to an antenna 119 by a transmission line 118, TX SPMBPF is connected with two RF components: RX SPMBPF 120 through the transmission line 126 and the antenna 119. The TX port-matching part 116 is coupled in signal communication with the TX main part 114 and is configured to provide impedance matching in its RX band to match the connected RX SPMBPF 120 and the antenna at the antenna port 129. The impedance matching may be relatively high impedance in the RX band of the TX SPMBPF 112 as required by the well-known duplexer design principle.

RX SPMBPF 120 includes a RX main part 122 having a RX first port 123 of the RX SPMBPF that is connected to a receive port (RX port) 127 of the duplexer 110 by a transmission line 121. RX SPMBPF 120 further includes a RX port-matching part 124 having a RX second port 125 of the RX SPMBPF. The RX second port 125 is connect to transmission line 126.

The RX port-matching part 124 is coupled to in signal communication with the RX main part 122 and configured to receive a RF signal from the antenna port 129 through the transmission line 126. The RX port-matching part 124 is configured to provide impedance matching in its TX band to match the connected TX SPMBPF 112 and the antenna at the antenna port 129. The impedance matching may be relatively high impedance in the TX band of the RX SPMBPF 120 as required by the well-known duplexer design principle. The RX main part 122 is configured to filter a received RF signal and provide such signal through the RX first port 123 and the transmission line 121 to the receive port 127 of the duplexer 110.

In operation, the TX port-matching part 116, the RX port-matching part 124 and the antenna are matched at the antenna port 129, namely when TX band signal transmitted from the TX port 113 arrives at the antenna port 129, almost all of it will flow to the antenna, because the connected antenna are matched with the TX SPMBPF 112 in the TX band and the connected RX SPMBPF 120 shows the high impedance to it. When RX band signal received from the antenna arrives at the antenna port 129, almost all of it will flow to the RX SPMBPF, because the antenna is also matched with the RX SPMBPF in the RX band and the connected TX SPMBPF shows the high impedance to it. Since the antenna port 129 is set at the same location as the TX second port 117 of the TX SPMBPF and the short transmission line 126 is relatively short, so total loss between the antenna port 129 and the TX port 113 is smaller than the prior art, which is preferred by the duplexer design. Due to the same short transmission line 126, loss between the antenna port 129 and the RX port 127 is also smaller, which is also preferred. In particular, when the transmission line 126 is designed by using a high Q type LTCC material, both losses will be further reduced.

Figure 7:
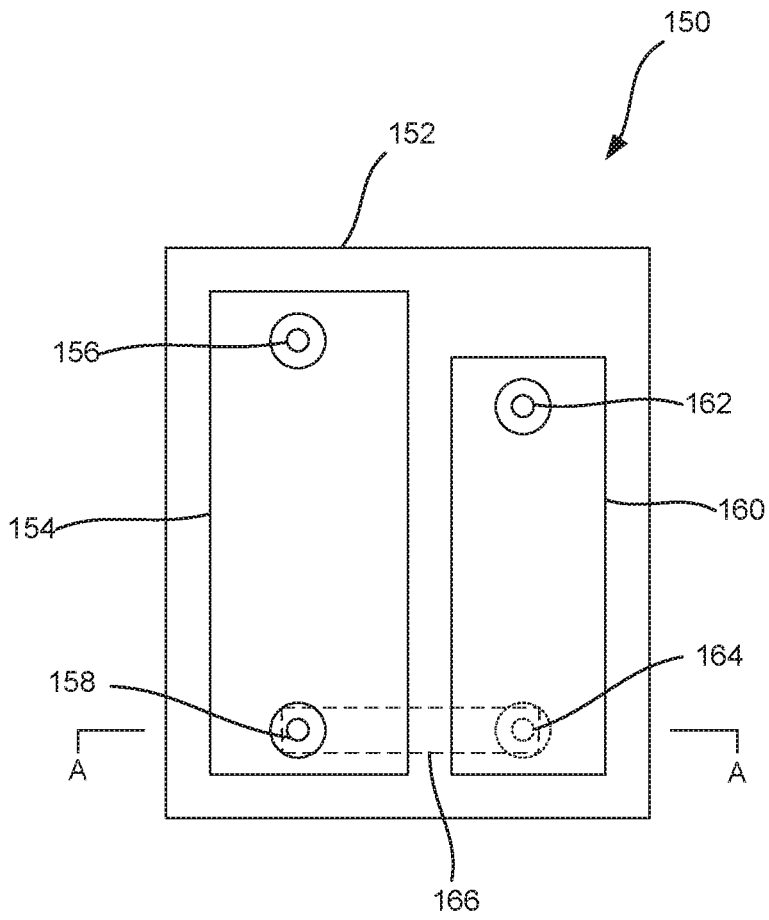
FIG. 7 is a top view of a schematic block diagram of an additional embodiment of a single-port-matched band pass filter-based duplexer of the present invention in a side-to-side configuration.
Figure 8:
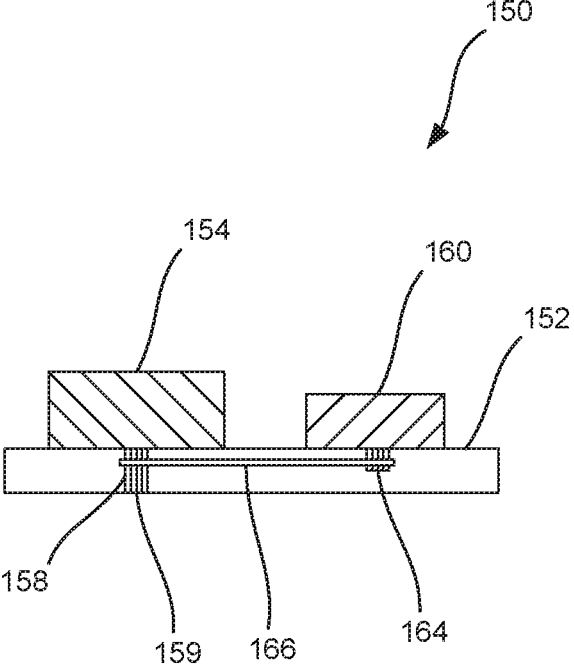
FIG. 8 is a side section view of a schematic block diagram of additional embodiment of a single-port-matched band pass filter-based duplexer of FIG. 7.

Embodiments of the SPMBPF of the present invention may allow for various configurations of a duplexer. FIGS. 7 and 8 illustrate an embodiment of a configuration of a duplexer 150. In this embodiment, duplexer 150 includes a TX SPMBPF 154 and an RX SPMBPF 160 affixed to a surface of a printed circuit board (PCB) 152 in a side-by-side configuration. The TX SPMBPF 154 includes a TX input port 156 and a TX path output port 158. RX SPMBPF 160 includes a RX output port 162 and an RX path input port 164. TX SPMBPF 154 and RX SPMBPF 160 are configured in a similar configuration to the SPMBPF discussed above, e.g. each having a filter main part and a port-matching part.

In this embodiment, due to the TX SPMBPF 154 and RX SPMBPF 160 having impedance matching capabilities, the two SPMBPFs may be connected by a short transmission line. In this embodiment, transmission line 166 is designed within the PCB 152 and is connected to the TX path output port 158 and the RX path input port 164. The transmission line 166 is a part of the port-matching part of the RX SPMBPF 160. Further, in this embodiment, TX path output port 158 extends through to the bottom side of PCB 152 creating an antenna port 159. In some embodiments, the TX path output port 158 may be extended through body of the TX SPMBPF 154 to its top side creating the antenna port 159.

Figure 13:
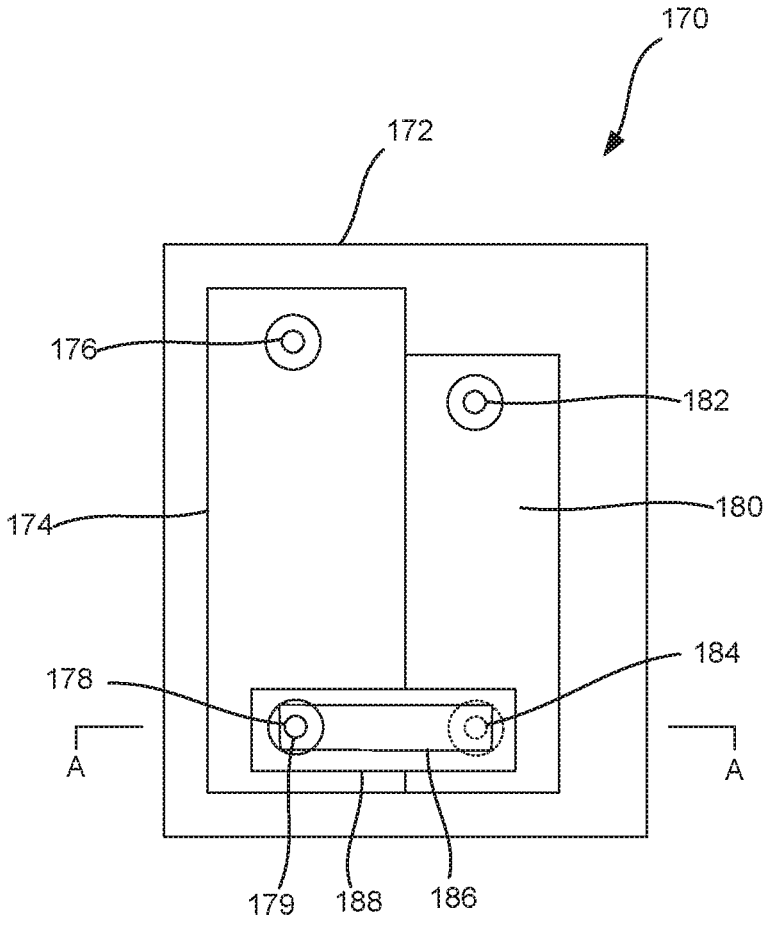
FIG. 13 is a top view of a schematic block diagram of an additional embodiment of a single-port-matched band pass filter-based duplexer of the present invention in a side-to-side configuration.
Figure 14:
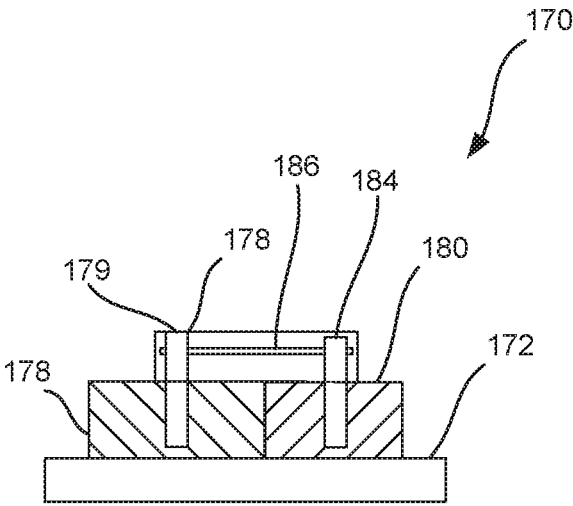
FIG. 14 is a side section view of a schematic block diagram of additional embodiment of a single-port-matched band pass filter-based duplexer of FIG. 13.

FIGS. 13 and 14 illustrate an additional embodiment of a configuration of a duplexer 170. In this embodiment, duplexer 170 includes a TX SPMBPF 174 and an RX SPMBPF 180 affixed to a surface of a printed circuit board (PCB) 172 in a side-by-side configuration. The TX SPMBPF 174 includes a TX input port 176 and a TX path output port 178. RX SPMBPF 180 includes a RX output port 182 and an RX path input port 184. TX SPMBPF 174 and RX SPMBPF 180 are configured in a similar configuration to the SPMBPF discussed above, e.g. each having a filter main part and a port-matching part.

In this embodiment, due to the TX SPMBPF 174 and RX SPMBPF 180 having impedance matching capabilities, the two SPMBPFs may be connected by a short transmission line. In this embodiment, transmission line 186 is designed within a substrate 188, such as a low-temperature co-fired ceramic (LTCC) board or a printed circuit board (PCB), and is connected to the TX path output port 178 and the RX path input port 184. Further, in this embodiment, TX path output port 178 extends through the substrate 188 creating a common antenna port 179.

Figure 9:
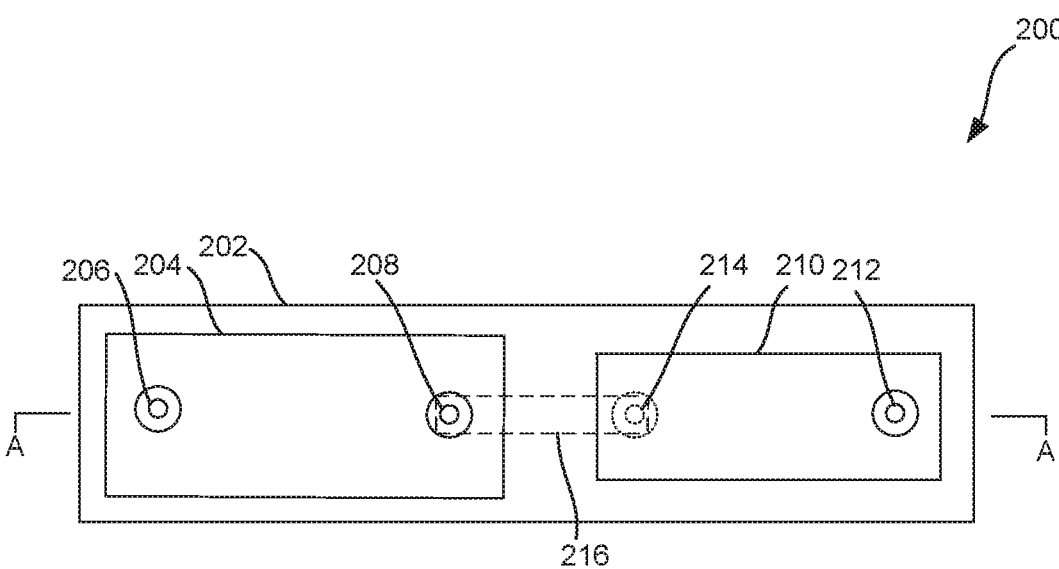
FIG. 9 is a top view of a schematic block diagram of an additional embodiment of a single-port-matched band pass filter-based duplexer of the present invention in an end-to-end configuration.
Figure 10:
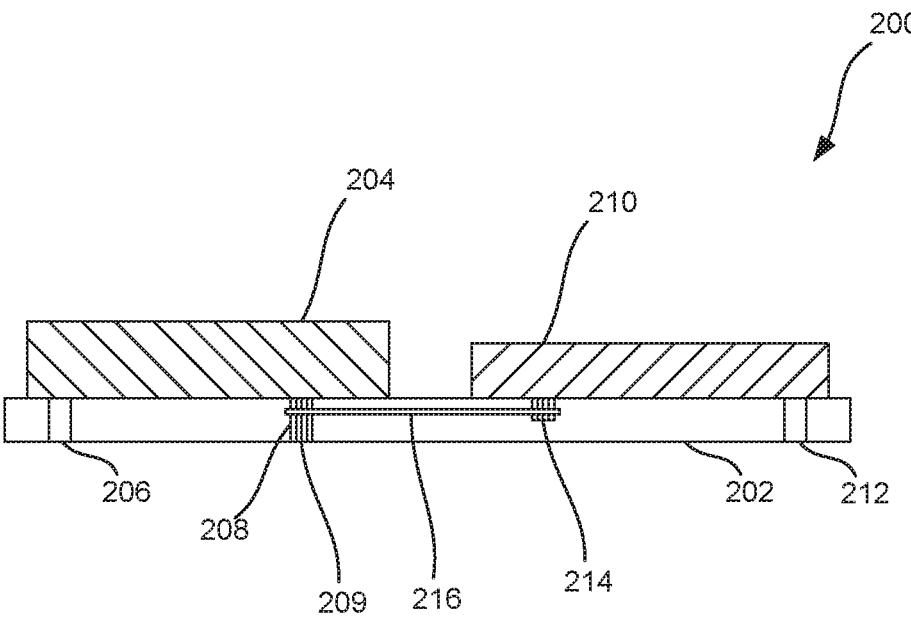
FIG. 10 is a side section view of a schematic block diagram of additional embodiment of a single-port-matched band pass filter-based duplexer of FIG. 9.

FIGS. 9 and 10 illustrate an additional embodiment of a configuration of a duplexer 200. In this embodiment, duplexer 200 includes a TX SPMBPF 204 and an RX SPMBPF 210 affixed to a surface of a printed circuit board (PCB) 202 in an end-to-end configuration. The TX SPMBPF 204 includes a TX input port 206 and a TX path output port 208. RX SPMBPF 210 includes a RX output port 212 and an RX path input port 214. TX SPMBPF 204 and RX SPMBPF 210 are configured in a similar configuration as the SPMBPF discussed above, e.g. each having a main part and a port-matching part.

In this embodiment, TX input port 206 and RX output port 212 extends through to the bottom side of PCB 202. Further, transmission line 216 is designed within the PCB 202 and is connected to the TX path output port 208 and the RX path input port 214. Further, in this embodiment, TX path output port 208 extends through to the bottom side of PCB 202 creating an antenna port 209. In some embodiments, the TX path output port 208 may be extended through body of the TX SPMBPF 204 to its top side creating the antenna port 209.

Figure 11:
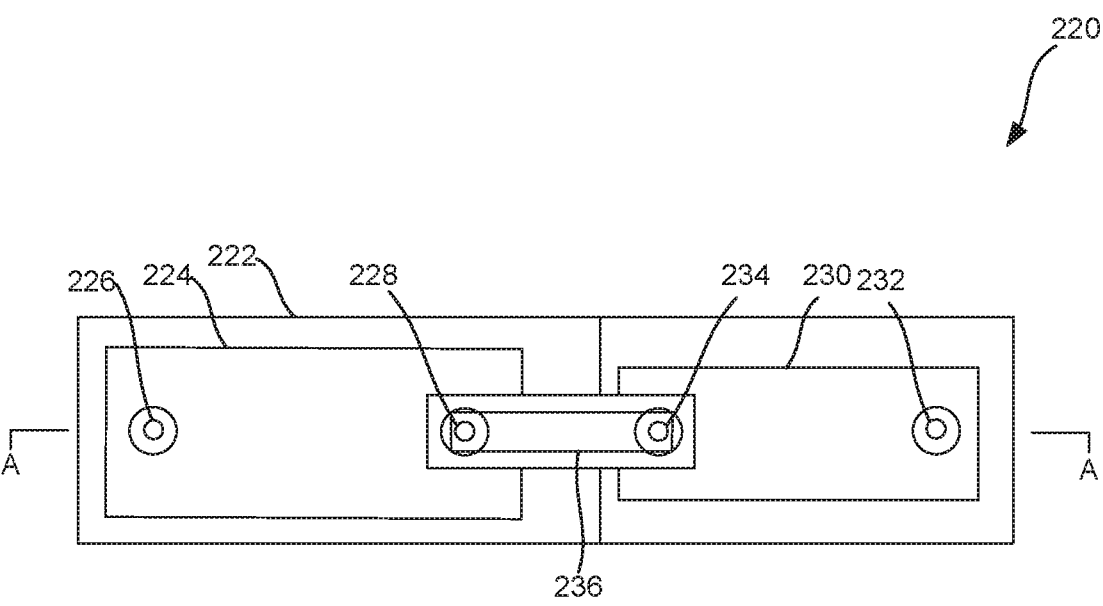
FIG. 11 is a top view of a schematic block diagram of an additional embodiment of a single-port-matched band pass filter-based duplexer of the present invention in an end-to-end configuration.
Figure 12:
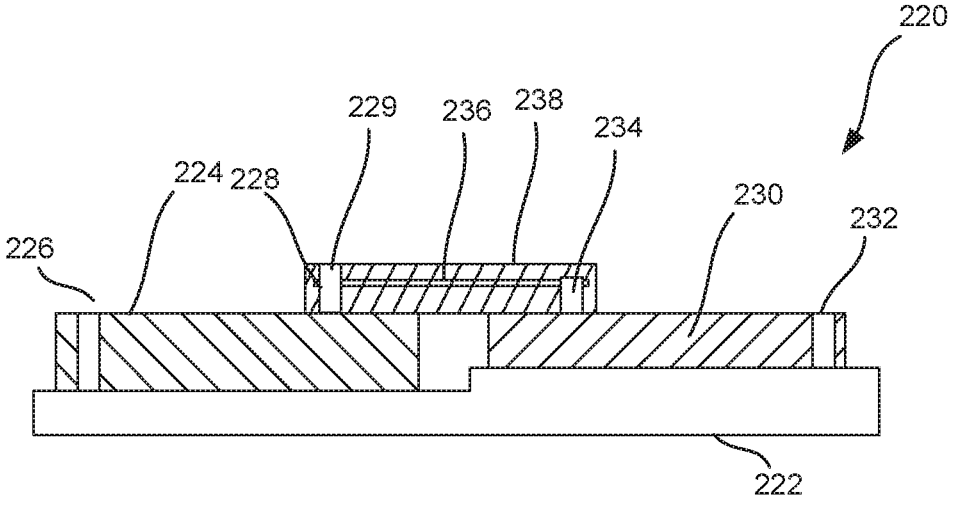
FIG. 12 is a side section view of a schematic block diagram of additional embodiment of a single-port-matched band pass filter-based duplexer of FIG. 11.

FIGS. 11 and 12 illustrate an additional embodiment of a configuration of a duplexer 220. In this embodiment, duplexer 220 includes a TX SPMBPF 224 and an RX SPMBPF 230 affixed to a surface of a carrier board 222 in an end-to-end configuration. The TX SPMBPF 224 includes a TX input port 226 and a TX path output port 228. RX SPMBPF 230 includes a RX output port 232 and an RX path input port 234. TX SPMBPF 224 and RX SPMBPF 230 are configured in a similar configuration as the SPMBPF discussed above, e.g. each having a main part and a port-matching part.

In this embodiment, due to the TX SPMBPF 224 and RX SPMBPF 230 having impedance matching capabilities, the two SPMBPFs may be connected by a short transmission line. In this embodiment, transmission line 236 is designed within a substrate 238, such as a low-temperature co-fired ceramic (LTCC) board or a printed circuit board (PCB), and is connected to the TX path output port 228 and the RX path input port 234. Further, in this embodiment, TX path output port 228 extends through the substrate 238 creating a common antenna port 229.

Figure 15:
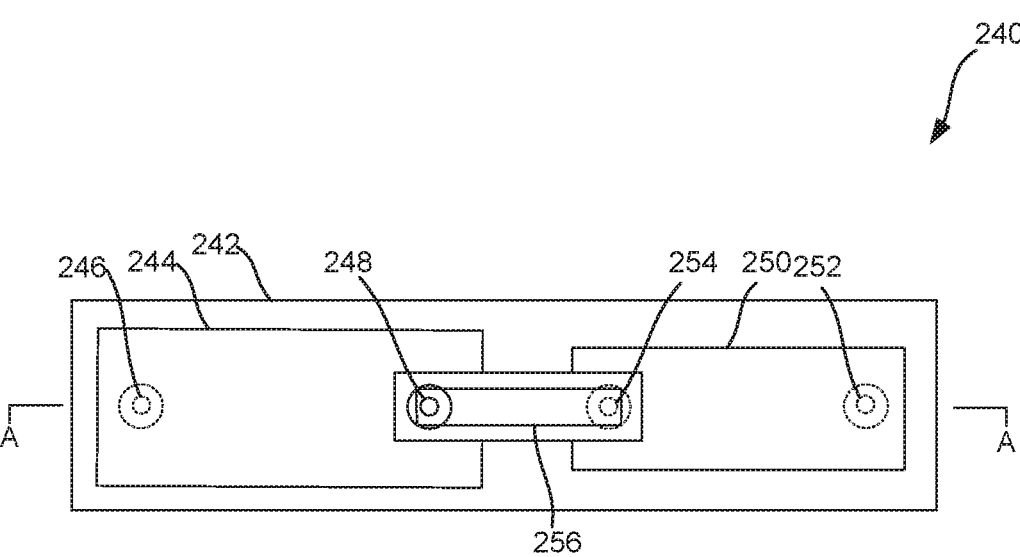
FIG. 15 is a top view of a schematic block diagram of an additional embodiment of a single-port-matched band pass filter-based duplexer of the present invention in an end-to-end configuration.
Figure 16:
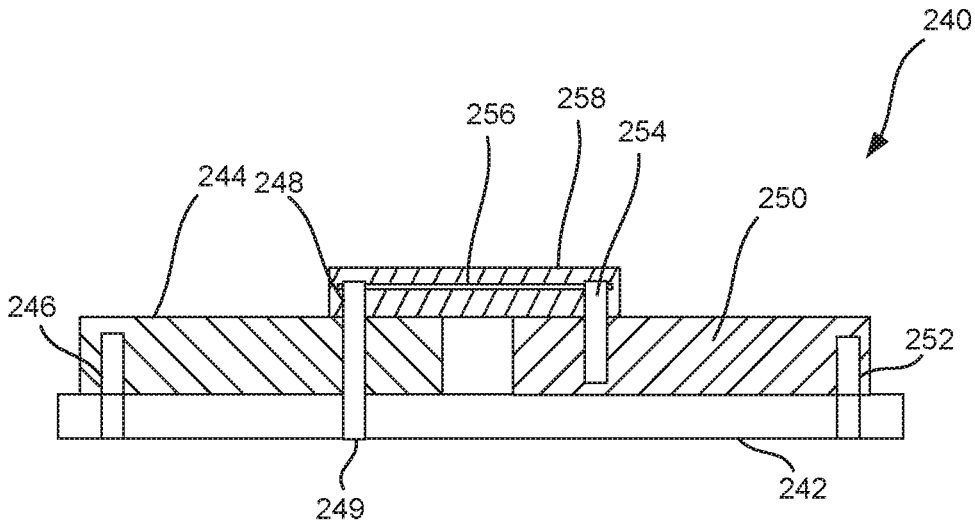
FIG. 16 is a side section view of a schematic block diagram of additional embodiment of a single-port-matched band pass filter-based duplexer of FIG. 15

FIGS. 15 and 16 illustrate an additional embodiment of a configuration of a duplexer 240. In this embodiment, duplexer 240 includes a TX SPMBPF 244 and an RX SPMBPF 250 affixed to a surface of a printed circuit board (PCB) 242 in an end-to-end configuration. The TX SPMBPF 244 includes a TX input port 246 and a TX path output port 248. RX SPMBPF 250 includes a RX output port 252 and an RX path input port 254. TX SPMBPF 244 and RX SPMBPF 250 are configured in a similar configuration as the SPMBPF discussed above, e.g. each having a main part and a port-matching part.

In this embodiment, due to the TX SPMBPF 244 and RX SPMBPF 250 having impedance matching capabilities, the two SPMBPFs may be connected by a short transmission line. In this embodiment, transmission line 256 is designed within a substrate 258, such as a low-temperature co-fired ceramic (LTCC) board or a printed circuit board (PCB), and is connected to the TX path output port 248 and the RX path input port 254. Further, in this embodiment, TX path output port 248 extends through body of the TX SPMBPF 244 and the PCB 242 to the underside of the PCB creating a common antenna port 249.

Further, TX input port 246, TX path output port 248 and RX output port 252 extend through the PCB 242 allowing access to the TX SPMBPF 244 and an RX SPMBPF 250 through the underside of the PCB 242.

Figure 17:
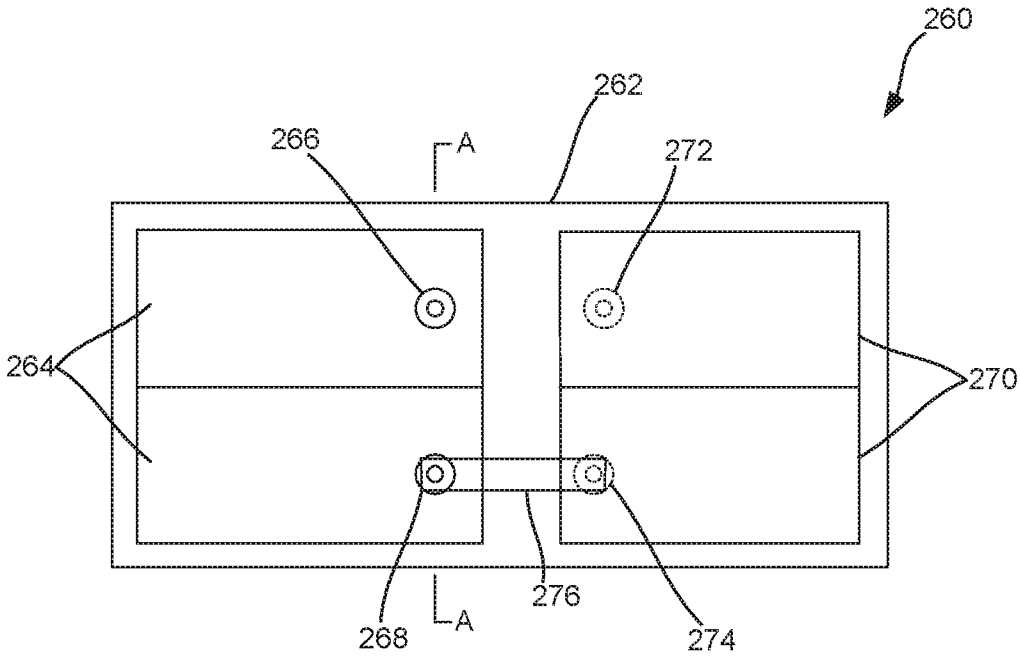
FIG. 17 is a top view of a schematic block diagram of an additional embodiment of a single-port-matched band pass filter-based duplexer of the present invention in an end-to-end configuration.
Figure 18:
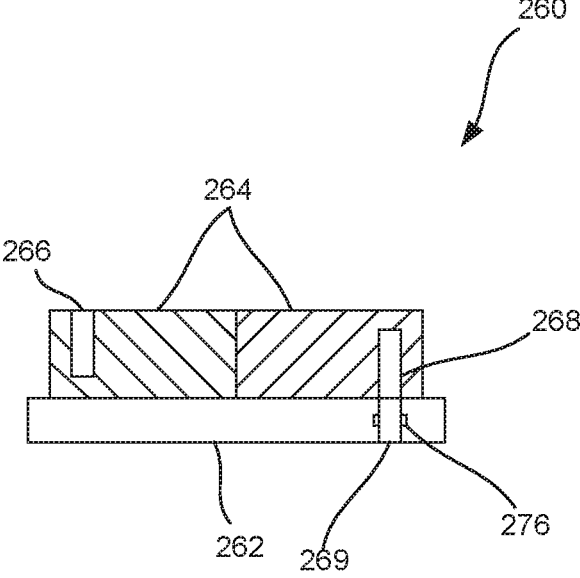
FIG. 18 is a side section view of a schematic block diagram of additional embodiment of a single-port-matched band pass filter-based duplexer of FIG. 17

FIGS. 17 and 18 illustrate an additional embodiment of a configuration of a duplexer 260. In this embodiment, duplexer 260 includes a TX SPMBPF 264 and an RX SPMBPF 270 affixed to a surface of a printed circuit board (PCB) 262 in an end-to-end configuration. The TX SPMBPF 264 includes a TX input port 266 and a TX path output port 268. In this embodiment, TX input port 266 and a TX path output port 268 are arranged such that they are close each other. RX SPMBPF 270 includes a RX output port 272 and an RX path input port 274. In this embodiment, RX output port 272 and an RX path input port 274 are arranged such that they are close each other. TX SPMBPF 264 and RX SPMBPF 270 are configured in a similar configuration as the SPMBPF discussed above, e.g. each having a main part and a port-matching part.

In this embodiment, transmission line 276 is designed within the PCB 262 and is connected to the TX path output port 268 and the RX path input port 274. Further, in this embodiment, TX path output port 268 extends through to the bottom side of PCB 262 creating an antenna port 269.

Figure 19:
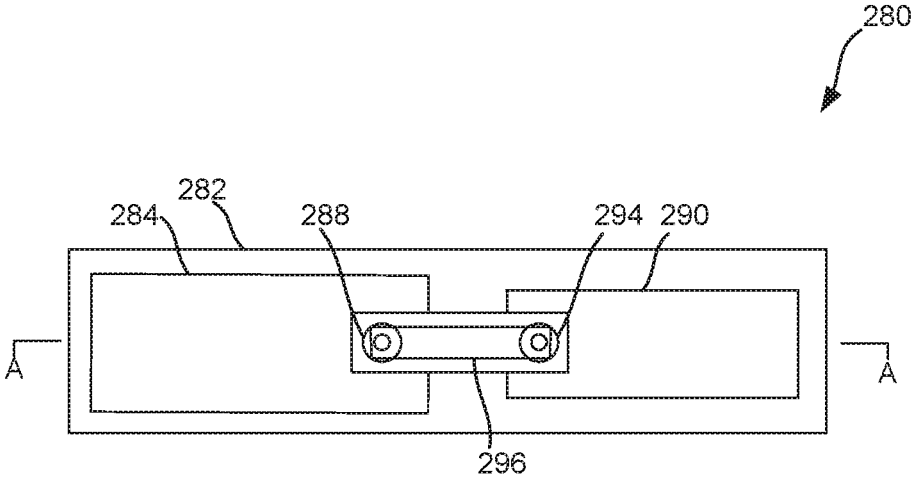
FIG. 19 is a top view of a schematic block diagram of an additional embodiment of a single-port-matched band pass filter-based duplexer of the present invention in an end-to-end configuration.
Figure 20:
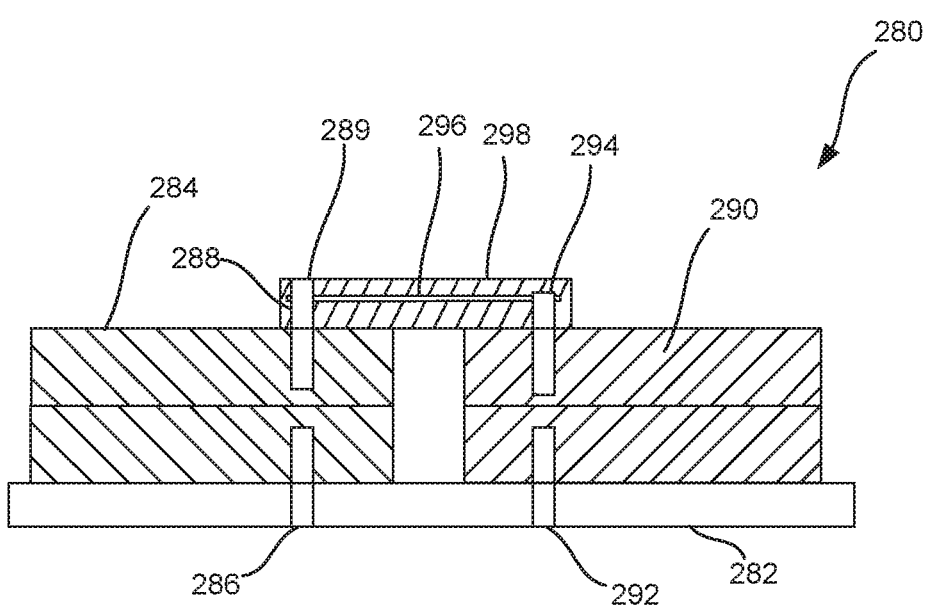
FIG. 20 is a side section view of a schematic block diagram of additional embodiment of a single-port-matched band pass filter-based duplexer of FIG. 19

FIGS. 19 and 20 illustrate an additional embodiment of a configuration of a duplexer 280. In this embodiment, duplexer 280 includes a TX SPMBPF 284 and an RX SPMBPF 290 affixed to a surface of a printed circuit board (PCB) 282 in an end-to-end configuration. The TX SPMBPF 284 includes a TX input port 286 and a TX path output port 288. In this embodiment, TX input port 286 and a TX path output port 288 are arranged such that they are in different layer of the TX SPMBPF 284. RX SPMBPF 290 includes a RX output port 292 and an RX path input port 294. In this embodiment, RX output port 292 and an RX path input port 294 are arranged such that they are in different layer of the RX SPMBPF 290. TX SPMBPF 284 and RX SPMBPF 290 are configured in a similar configuration as the SPMBPF discussed above, e.g. each having a main part and a port-matching part.

In this embodiment, transmission line 296 is designed within a substrate 298, such as a low-temperature co-fired ceramic (LTCC) board or a printed circuit board (PCB), and is connected to the TX path output port 288 and the RX path input port 294. Further, in this embodiment, TX path output port 288 extends through to the top side of substrate 298 creating an antenna port 289. Further, TX input port 286 and RX output port 292 extend through to the bottom side of PCB 282 allowing access therefrom.

Figure 21:
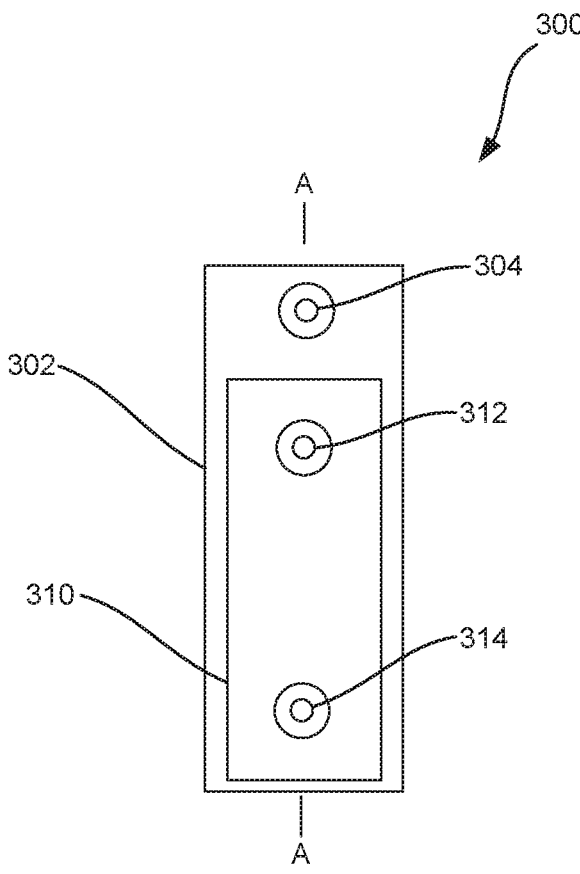
FIG. 21 is a top view of a schematic block diagram of an additional embodiment of a single-port-matched band pass filter-based duplexer of the present invention in a stacked configuration.
Figure 22:
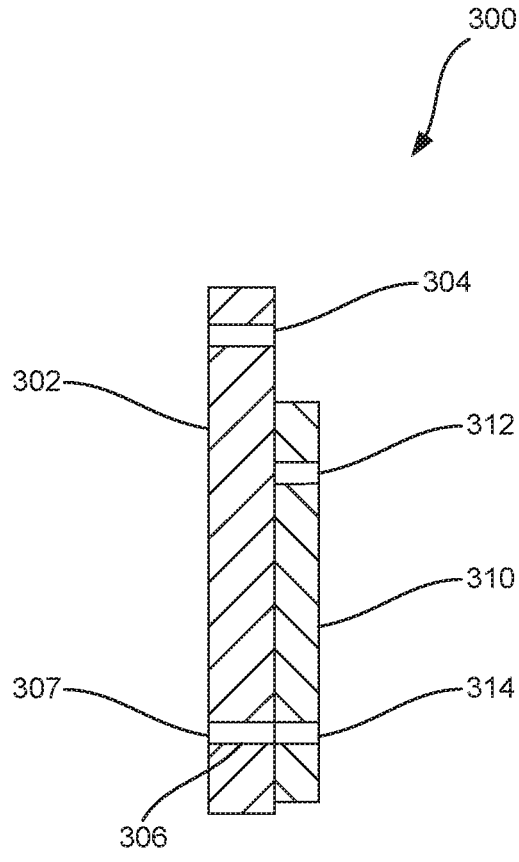
FIG. 22 is a side section view of a schematic block diagram of additional embodiment of a single-port-matched band pass filter-based duplexer of FIG. 21.
Figure 24:
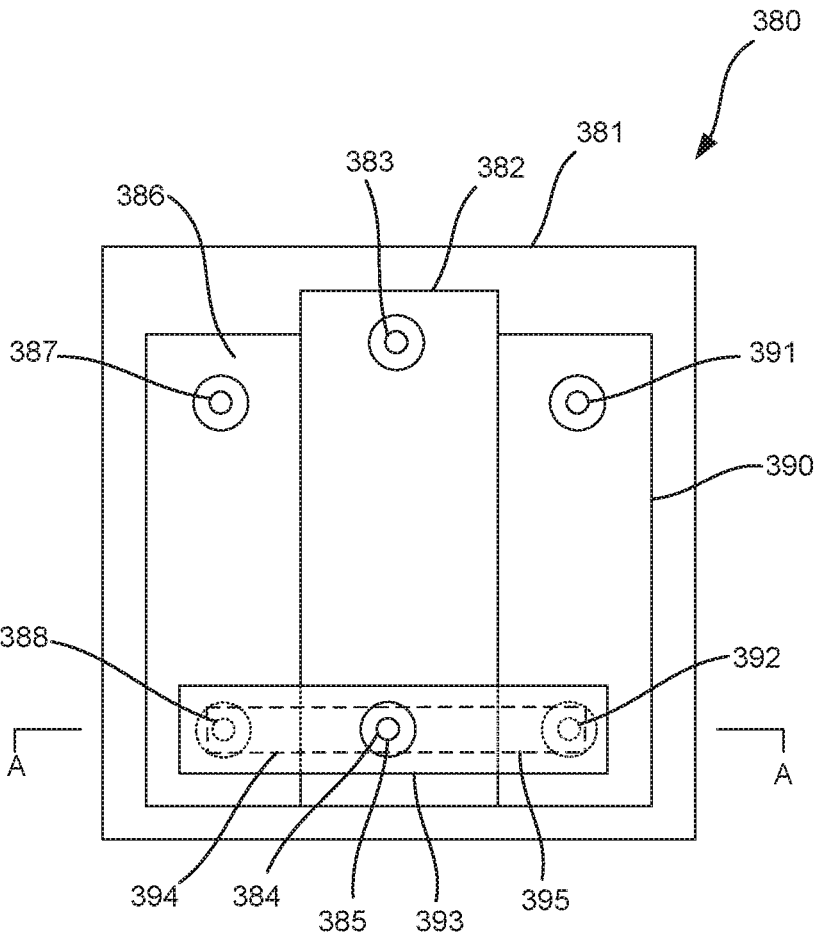
FIG. 24 is a top view of a schematic block diagram of an additional embodiment of a single-port-matched band pass filter-based multiplexer of the present invention in a side-to-side configuration.

FIGS. 21 and 22 illustrate an additional embodiment of a configuration of a duplexer 300. In this embodiment, duplexer 300 includes an RX SPMBPF 310 affixed to a TX SPMBPF 302 in a stacked configuration. The TX SPMBPF 302 includes a TX input port 304 and a TX path output port 306. RX SPMBPF 310 includes a RX output port 312 and an RX path input port 314. TX SPMBPF 302 and RX SPMBPF 310 are configured in a similar configuration as the SPMBPF discussed above, e.g. each having a filter main part and a port-matching part. In this embodiment, TX path output port 306 and the RX path input port 314 align to create an antenna port 307.

As illustrated in FIG. 23 an embodiment of a multiplexer 320 utilizing embodiments of the SPMPBF is illustrated. Multiplexer 320 includes a plurality of single-port-matched band pass filters (SPMBPFs) 322, 332, 342, 352. The multiplexer may include any number of the SPMBPFs as required by the needs and requirements placed upon the multiplexer. In this embodiment, a part of the SPMBPFs are a TX SPMBPF that is on transmit path (TX) of the multiplexer 320 and rest of the SPMBPFs are a RX SPMBPF that is on receive path (RX) of the multiplexer 320.

Transmission lines 360, 362, 364 extend between the SPMBPFs 322, 332, 342, 352, respectively and are connected to a common antenna port 339 that is set at one of TX path output ports of the TX SPMBPFs.

Each of the SPMBPFs 322, 332, 342, 352 includes a filter main part 324, 334, 344, 354 having a port 325, 335, 345, 355 that is connected to a transmit port if the SPMBPF is a TX SPMBPF, or a receive port if the SPMBPF is a RX SPMBPF, of a radio board by a transmission line. Each of SPMBPFs 322, 332, 342, 352 further includes a port-matching part 326, 336, 346, 356 having a TX path output port if the SPMBPF is a TX SPMBPF, or a RX path input port if the SPMBPF is a RX SPMBPF, 327, 337, 347, 357. The filter main part 324, 334, 344, 354 is configured to filter a transmit RF signal provided through its transmit input port, which is one of the ports 325, 335, 345, 355 if the SPMBPF is a TX SPMBPF, or to filter a receive RF signal provided through its receive input port, which is one of the port 327, 337, 347, 357 if the SPMBPF is a RX SPMBPF. The port-matching parts 326, 336, 346, 356 are coupled in signal communication with their respective filter main parts 324, 334, 344, 354. The port-matching parts 326, 336, 346, 356 are further configured to provide impedance matching in all pass bands of the SPMBPFs other than pass band of its own SPMBPF at the antenna port 339. The impedance matching may be relatively high impedance in the all pass bands other than its own pass band as required by the well-known multiplexer design principle.

Also, the antenna port 339 can be set at any location on the transmission lines 360, 362, 364 as required by the needs and requirements placed upon the multiplexer.

Embodiments of the SPMBPF of the present invention may allow for various configurations of a multiplexer. FIGS.

24 and 25 illustrate an embodiment of a configuration of a multiplexer 380. In this embodiment, multiplexer 380 includes a TX SPMBPF 382, a first RX SPMBPF 386 and a second RX SPMBPF 390 affixed to a surface of a carrier printed circuit board (PCB) 381 in a side-by-side configuration. The TX SPMBPF 382 includes a TX input port 383 and a TX path output port 384. The first RX SPMBPF 386 includes a first RX output port 387 and a first RX path input port 388. The second RX SPMBPF 390 includes a second RX output port 391 and a second RX path input port 392. TX SPMBPF 382 and the RX SPMBPFs 386, 390 are configured in a similar configuration as the SPMBPF discussed above, e.g. each having a filter main part and a port-matching part.

In this embodiment, due to the TX SPMBPF 382 and the RX SPMBPFs 386, 390 having impedance matching capabilities, the SPMBPFs may be connected by short transmission lines 394, 395. In this embodiment, transmission lines 394, 395 are designed within a substrate 393, such as a low-temperature co-fired ceramic (LTCC) board or a printed circuit board (PCB), and is connected to the TX path output port 384 and the RX path input ports 388, 392. Further, in this embodiment, TX path output port 384 extends through the substrate 393 creating a common antenna port 385.

Figure 26:
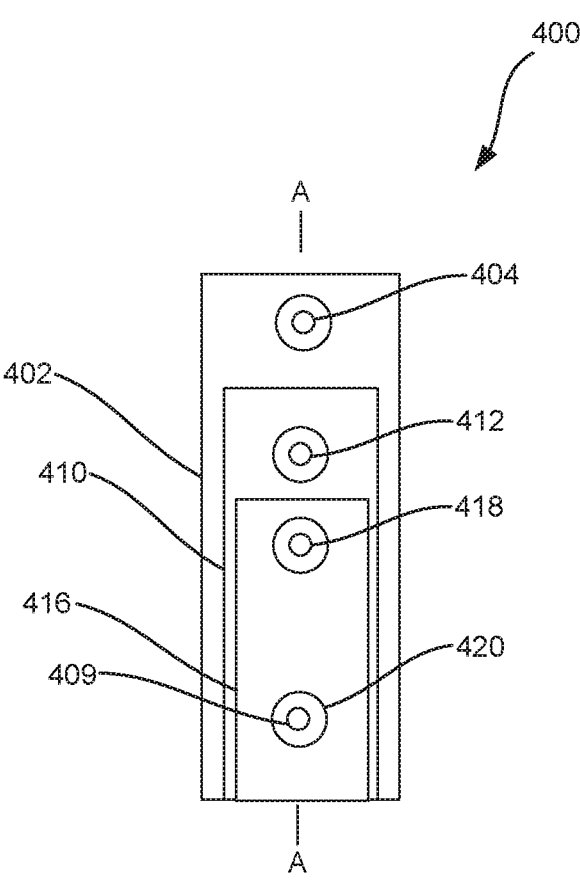
FIG. 26 is a top view of a schematic block diagram of an additional embodiment of a matched band pass filter-based multiplexer of the present invention in a stacked configuration.

FIG. 26 illustrate an additional embodiment of a configuration of a multiplexer 400. In this embodiment, multiplexer 400 includes a first RX SPMBPF 410 affixed to a TX SPMBPF 402, and a second RX SPMBPF 416 affixed to the first RX SPMBPF 410 in a stacked configuration. The TX SPMBPF 402 includes a TX input port 404 and a TX path output port 406. The first RX SPMBPF 410 includes a first RX output port 412 and a first RX path input port 414. The second RX SPMBPF 416 includes a second RX output port 418 and a second RX path input port 420. TX SPMBPF 402 and the RX SPMBPFs 410, 416 are configured in a similar configuration as the SPMBPF discussed above, e.g. each having a filter main part and a port-matching part.

Figure 27:
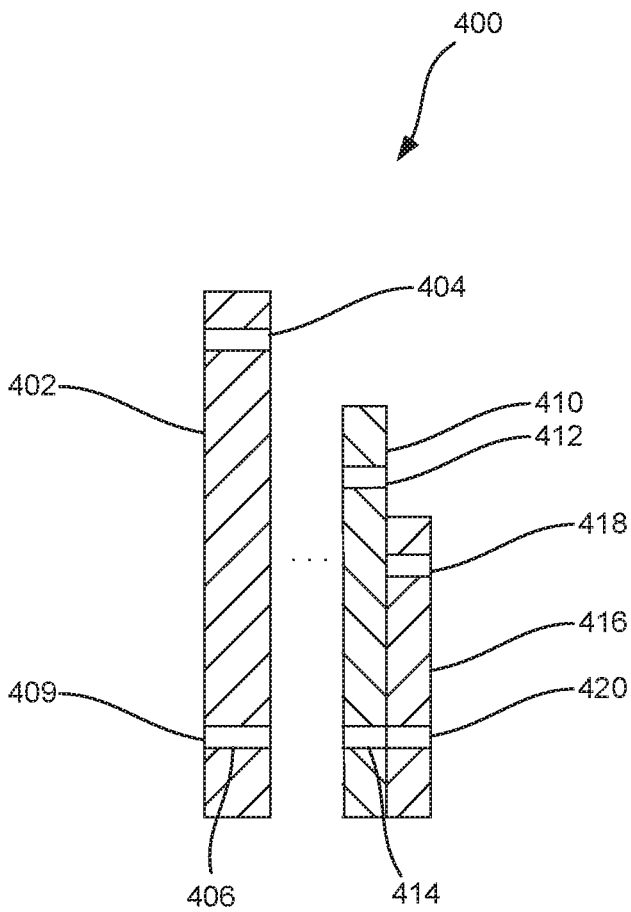
FIG. 27 is a side section view of a schematic block diagram of additional embodiment of a matched band pass filter-based multiplexer of FIG. 26.

In this embodiment, TX path output port 406 and the RX path input ports 414, 420 align to create a common antenna port 409. In this embodiment, the configuration includes one TX SPMBPF 402 and two RX SPMBPFs 410, 416. However, as illustrated in FIG. 27, there may be N number of SPMBPFs arranged in the stacked configuration to allow for the inclusion of a multiple of SPMBPFs depending on the design criteria, and other needs, of the multiplexer 400. In that case, a part of the N SPMBPFs are a TX SPMBPF and all others are a RX SPMBPF.

Second Embodiment Dual-Port-Matched Band Pass Filter (DPMBPF)

Figure 28:
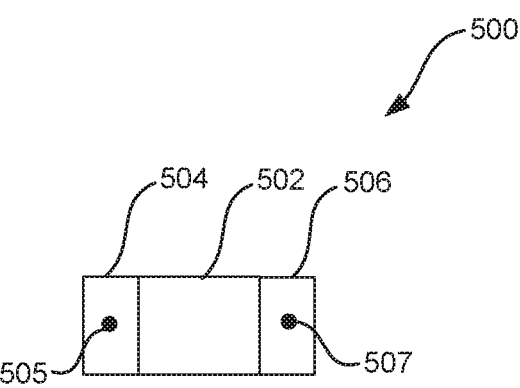
FIG. 28 is a schematic block diagram of an embodiment of a dual-port-matched band pass filter of the present invention.

FIG. 28 illustrates an additional embodiment of a dual-port-matched band pass filter (DPMBPF) 500. DPMBPF 500 is configured to filter an RF signal while providing impedance matching to connected RF components at its input and output ports and includes a filter main part 502, a first port-matching part 504 and a second port-matching part 506.

Filter main part 502 is configured to filter the RF signal. First port-matching part 504 is coupled, or otherwise connected, to filter main part 502 and is in signal communication with filter main part 502, i.e. the RF signal may transfer between the filter main part 502 and first port-matching part 504. First port-matching part 504 includes, or otherwise forms, a first port 505 that is configured to be connected to an RF component. The RF component may be an additional one or more SPMBPF or DPMBPF, antenna, or another RF component.

Second port-matching part 506 is coupled, or otherwise connected, to filter main part 502 and is in signal communication with filter main part 502, i.e. the RF signal may transfer between the filter main part 502 and second port-matching part 506. Second port-matching part 506 includes, or otherwise forms, a second port 507 that is configured to be connected to an RF component. The RF component may be an additional one or more SPMBPF or DPMBPF, antenna, or another RF component.

First and second port-matching parts 504, 506 are further configured to provide impedance matching through the first and second ports 505, 507 to match the connected RF components. In some embodiments, the impedance matching may be defined as a relatively high impedance in a specified frequency range of out of passband of the DPMBPF 500 to match the connected RF components. The first and second port-matching ports 504, 506 are designed together with the filter main part 502 using the same material and manufacture process.

Figure 29:
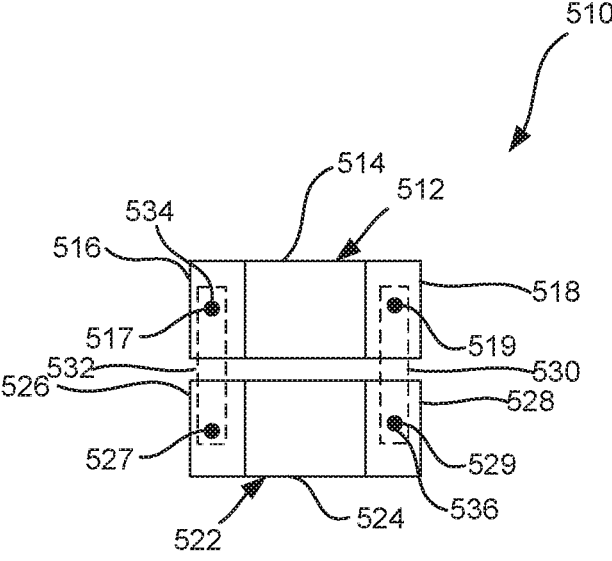
FIG. 29 is a schematic block diagram of an embodiment of a dual-port-matched band pass filter-based dual-band filter of the present invention.

As illustrated in FIG. 29, an embodiment of a dual-band filter 510 utilizing embodiments of the DPMPBF 500 is illustrated. Filter 510 includes a first dual-port-matched band pass filter (DPMBPF) 512 and a second DPMBPF 522. Transmission lines 530, 532 extends between DPMBPF 512 and DPMBPF 522 and are connected to common ports 534, 536 for both DPMBPFs 512, 522, as discussed below.

Both DPMBPFs 512, 522 include a main part 514, 524 configured to filter RF signals. DPMBPFs 512, 522 further includes a first port-matching part 516, 526 having a first port 517, 527. The first port-matching parts 516, 526 are coupled in signal communication with the main parts 514, 524 respectively. First port-matching parts 516, 526 are configured to provide the RF signal to a common input port 534 through the transmission line 532. The first port-matching parts 516, 526 are further configured to provide impedance matching at the common input port 534. The impedance matching of the first port-matching part 516 may be a relatively high impedance in passband of DPMBPF 522 for matching with the first port-matching part 526 and the transmission line 532. Similarly, the impedance matching of the first port-matching part 526 may be a relatively high impedance in passband of DPMBPF 512 for matching with the first port-matching part 516 and the transmission line 532.

DPMBPFs 512, 522 further include a second port-matching part 518, 528 having a second port 519, 529. The second port-matching parts 518, 528 are coupled in signal communication with the main parts 514, 524 respectively. Second port-matching parts 518, 528 are configured to provide the RF signal to a common output port 536 through the transmission line 530. The second port-matching parts 518, 528 are further configured to provide impedance matching at the common output port 536. The impedance matching of the second port-matching part 528 may be a relatively high impedance in passband of DPMBPF 512 for matching with the second port-matching part 518 and transmission line 530. Similarly, the impedance matching of the second port-matching part 518 may be a relatively high impedance in passband of DPMBPF 522 for matching with the second port-matching part 528 and the transmission line 530.

Figure 30:
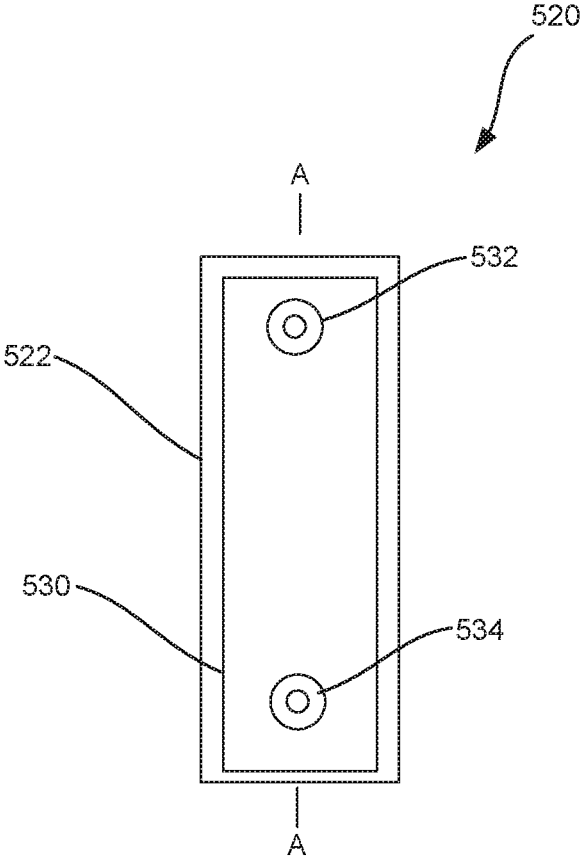
FIG. 30 is a top view of a schematic block diagram of an additional embodiment of a dual-port-matched band pass filter-based dual-band filter of the present invention in a stacked configuration.
Figure 31:
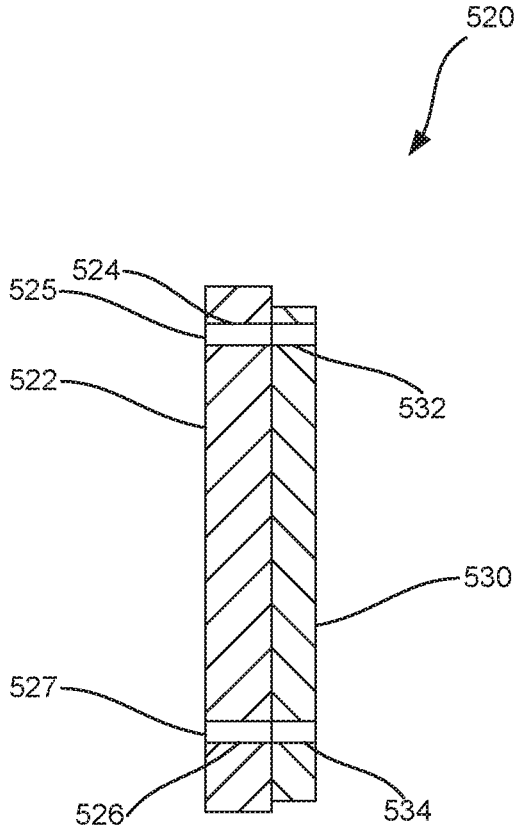
FIG. 31 is a side section view of a schematic block diagram of additional embodiment of a dual-port-matched band pass filter-based dual-band filter of FIG. 30.

FIGS. 30 and 31 illustrate an additional embodiment of a configuration of a dual-band filter 520. In this embodiment, filter 520 includes a first DPMBPF 522 affixed to a second DPMBPF 530 in a stacked configuration. The first DPMBPF 522 includes a first port 524 and a second port 526. The second DPMBPF 530 includes a first port 532 and a second port 534. The first DPMBPF 522 and second DPMBPF 530 are configured in a similar configuration as the DPMBPF discussed above, e.g. each having a main part along with first and second port-matching parts. In this embodiment, first port 524 and first port 532 are aligned to create a first common input/output port 525, and second port 526 and second port 534 are aligned to create a second common input/output port 527.

Figure 32:
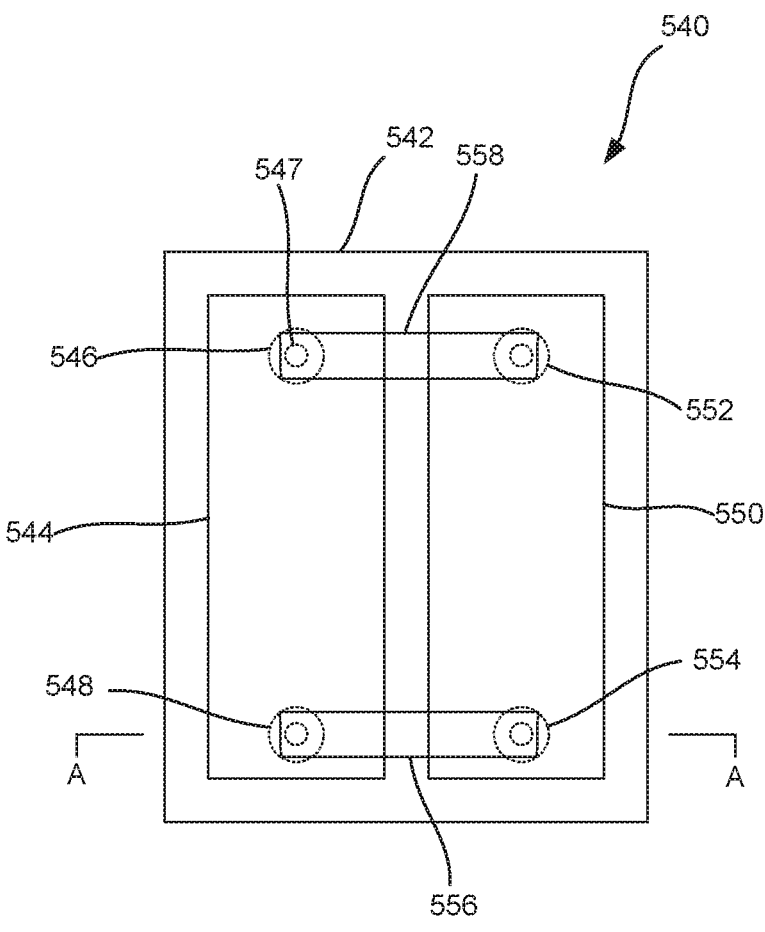
FIG. 32 is a top view of a schematic block diagram of an additional embodiment of a dual-port-matched band pass filter-based dual-band filter of the present invention in a side-to-side configuration.
Figure 33:
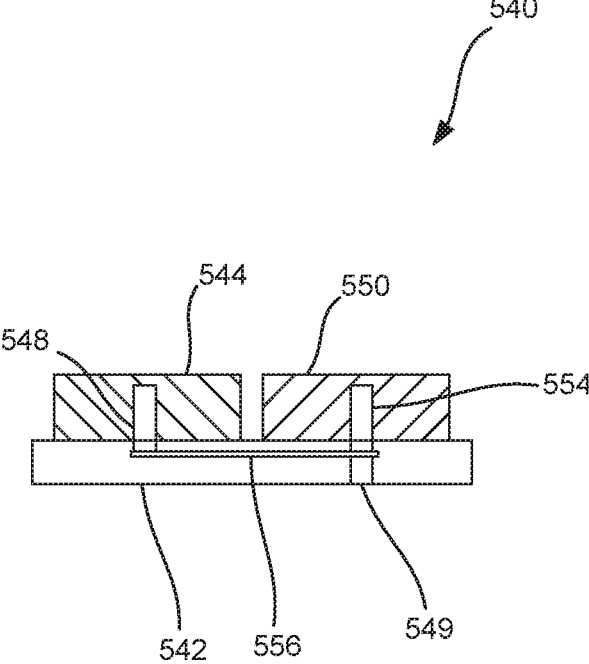
FIG. 33 is a side section view of a schematic block diagram of additional embodiment of a dual-port-matched band pass filter-based dual-band filter of FIG. 32.

FIGS. 32 and 33 illustrate an additional embodiment of a configuration of a dual-band filter 540. In this embodiment, filter 540 includes a first DPMBPF 544 and a second DPMBPF 550 affixed to a surface of a carrier printed circuit board (PCB) 542 in a side-by-side configuration. DPMBPFs 544, 550 are configured in a similar configuration as DPMBPF 500 discussed above, e.g. each having a main part, along with a first and a second port-matching part. Further, each include a first port 546, 552 and a second port 548, 554.

In this embodiment, due to the DPMBPF 544, 550 having impedance matching capabilities, the two DPMBPFs may be connected by a short transmission lines 556, 558. In this embodiment, transmission lines 556, 558 are designed within the PCB 542, with transmission line 556 being connected to first ports 548, 554 and transmission line 558 being connected to second ports 546, 552. Further, in this embodiment, first port 546 and second port 554 extend through to the bottom side of PCB 542 creating common ports 547, 549.

Figure 34:
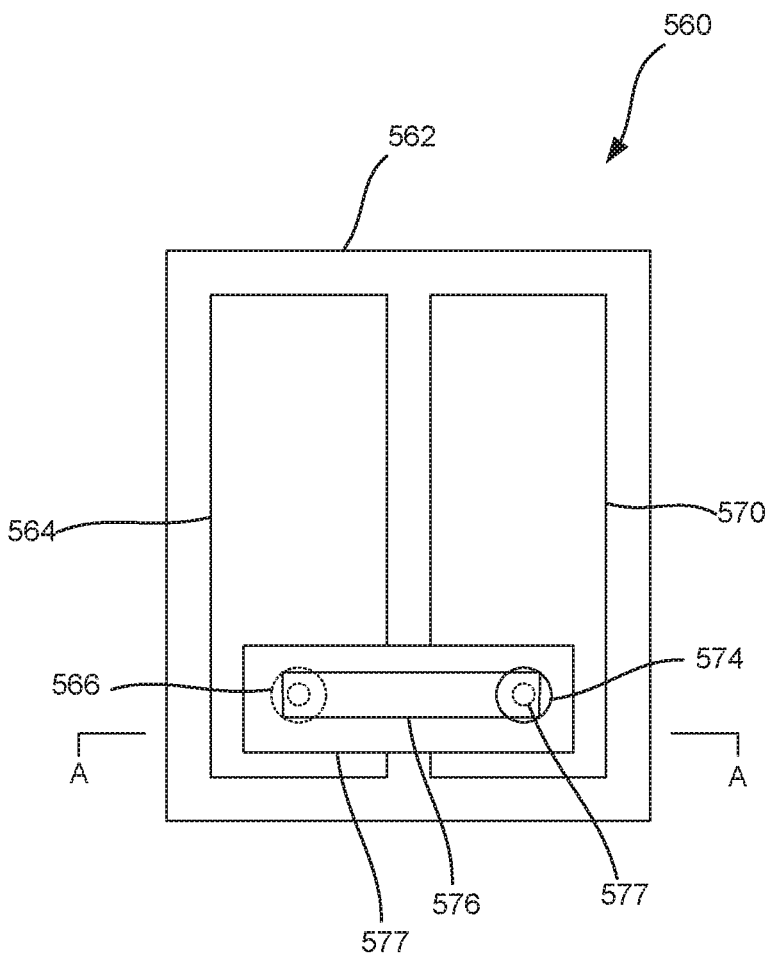
FIG. 34 is a top view of a schematic block diagram of an additional embodiment of a dual-port-matched band pass filter-based dual-band filter of the present invention in a side-to-side configuration.
Figure 35:
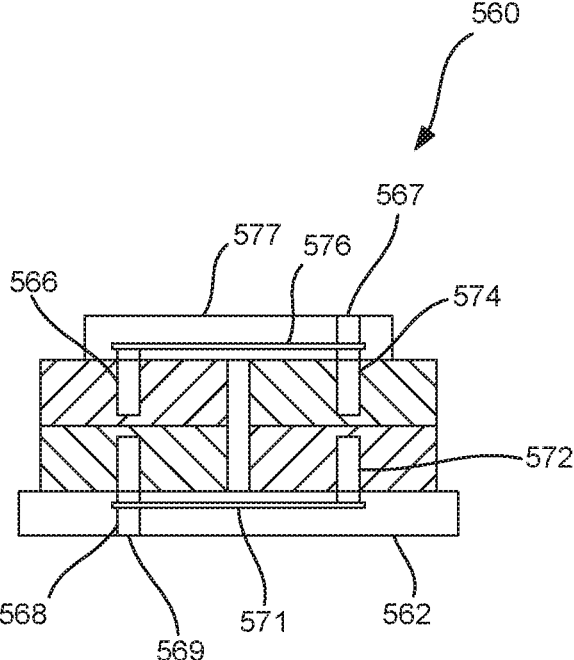
FIG. 35 is a side section view of a schematic block diagram of additional embodiment of a dual-port-matched band pass filter-based dual-band filter of FIG. 34.

FIGS. 34 and 35 illustrate an additional embodiment of a configuration of a dual band filter 560. In this embodiment, filter 560 includes a first DPMBPF 564 and a second DPMBPF 570 affixed to a surface of a carrier printed circuit board (PCB) 562 in a side-by-side configuration. DPMBPFs 564, 570 are configured in a similar configuration as DPMBPF 500 discussed above, e.g. each having a main part, along with a first and a second port-matching part. Further, each include a first port 566, 574 and a second port 568, 572.

In this embodiment, both DPMBPFs are arranged such that the first ports 566, 574 and the second ports 568, 572 are in different layers of the DPMBPFs.

Further, transmission line 571 is designed within PCB 562, and is connected to second ports 568, 572. Transmission line 576 is designed within a substrate 577, such as a low-temperature co-fired ceramic (LTCC) board or a printed circuit board (PCB), and is connected to the first ports 566, 574.

In this embodiment, first port extends through substrate 577 creating a first common port 567, and second port 568 extends through to the bottom side of PCB 562 creating a second port 569.

Figure 36:
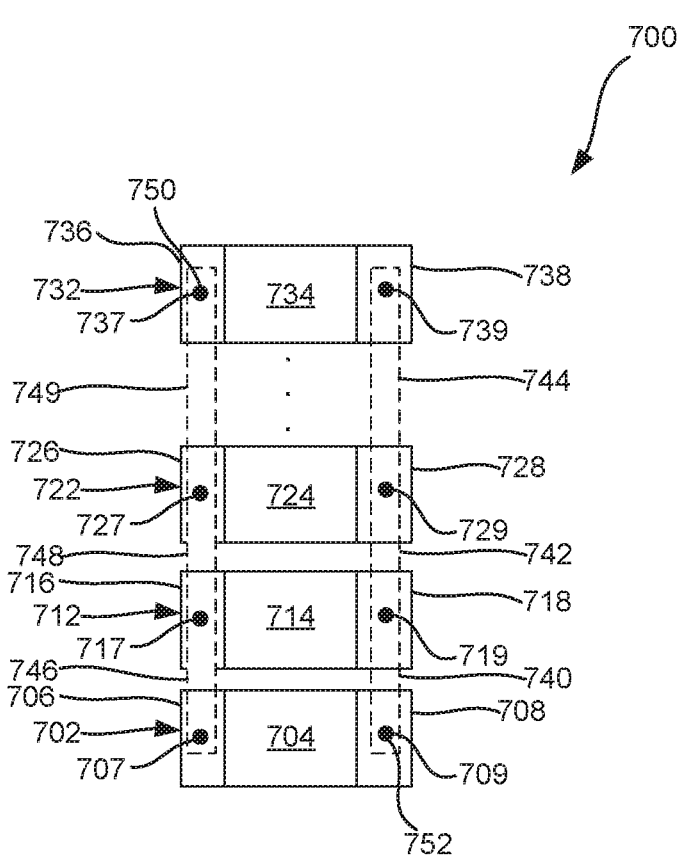
FIG. 36 is a schematic block diagram of an embodiment of a dual-port-matched band pass filter-based multiband filter of the present invention.

As illustrated in FIG. 36 an embodiment of a multiband filter 700 utilizing embodiments of DPMBPF 500 is illustrated. Filter 700 includes a plurality of dual-port-matched band pass filters (DPMBPFs) 702, 712, 722, 732. This embodiment includes four DPMBPFs which is illustrative. The filter may include any number of DPMBPFs as required by the needs and requirements placed upon the filter.

Transmission lines 740, 742, 744, 746, 748, 749 extends between DPMBPFs 702, 712, 722, 732 respectively and are connected to first and second common input/output ports 750, 752 for DPMBPFs 702, 712, 722, 732, as discussed below.

Each of the DPMBPFs 702, 712, 722, 732 includes a main part 704, 714, 724, 734, and further includes a first port-matching part 706, 716, 726, 736 having a first port 707, 717, 727, 737 and a second port-matching part 708, 718, 728, 738 having a second port 709, 719, 729, 739, both of which are coupled in signal communication with their respective main part 704, 714, 724, 734.

First port-matching parts 706, 716, 726, 736 are configured to transmit and/or receive a RF signal from the first common input/output port 750 through transmission lines 746, 748, 749. Second port-matching parts 708, 718, 728, 738 are configured to transmit and/or receive a RF signal from the second common input/output port 752 through transmission lines 740, 742, 744.

The common input/output port 750 can be set at any location on the transmission lines 746, 748, 749 as required by the needs and requirements placed upon the multiband filter. Similarly, the common input/output port 752 can be set at any location on the transmission lines 740, 742, 744 as required by the needs and requirements placed upon the multiband filter.

The first port-matching parts 706, 716, 726, 736 are configured to provide impedance matching in all pass bands of the connected DPMBPFs except for its own DPMBPF at the common input/output port 750. The impedance matching may be relatively high impedance in the all pass bands other than its own pass band as required by the well-known multiplexer design principle. The second port-matching parts 708, 718, 728, 738 are configured to provide impedance matching in all pass bands of the connected DPMBPFs except for its own DPMBPF at the common input/output port 752. The impedance matching may be relatively high impedance in the all pass bands other than its own pass band as required by the well-known multiplexer design principle.

Figure 37:
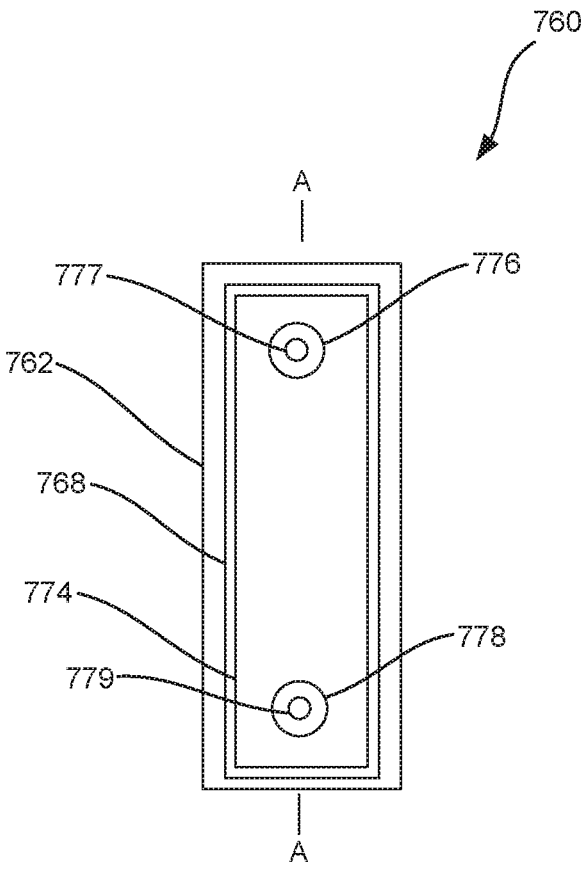
FIG. 37 is a top view of a schematic block diagram of an additional embodiment of a dual-port-matched band pass filter-based multiband filter of the present invention in a stacked configuration.
Figure 38:
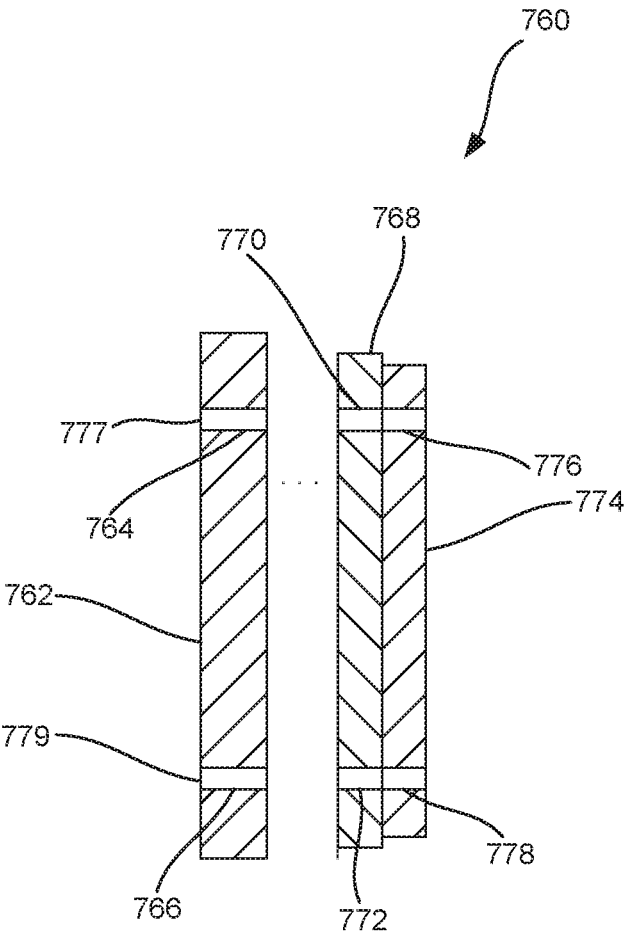
FIG. 38 is a side section view of a schematic block diagram of additional embodiment of a dual-port-matched band pass filter-based multiband filter of FIG. 37.

FIGS. 37 and 38 illustrate an additional embodiment of a configuration of a multiband filter 760. In this embodiment, filter 760 includes a first DPMBPF 762, a second DPMBPF 768 and a third DPMBPF 774 in a stacked configuration. DPMBPFs 762, 768, 774 are configured in a similar configuration as DPMBPF 500 discussed above, e.g. each having a main part, along with a first and a second port-matching part. Further, DPMBPFs 762, 768, 774 each include a first port 764, 770, 776 and a second port 766, 772, 778. In this embodiment, first port 764, 770, 776 are aligned to create a first common input/output port 777, and second port 766, 772, 778 are aligned to create a second common input/output port 779.

In this embodiment, the configuration includes three DPMBPFs 762, 768, 774. This is illustrative. As illustrated in FIG. 38, there may be N number of DPMBPFs arranged in the stacked configuration to allow for the inclusion of a multiple of DPMBPFs depending on the design criteria, and other needs, of the multiband filter 760.

Figure 39:
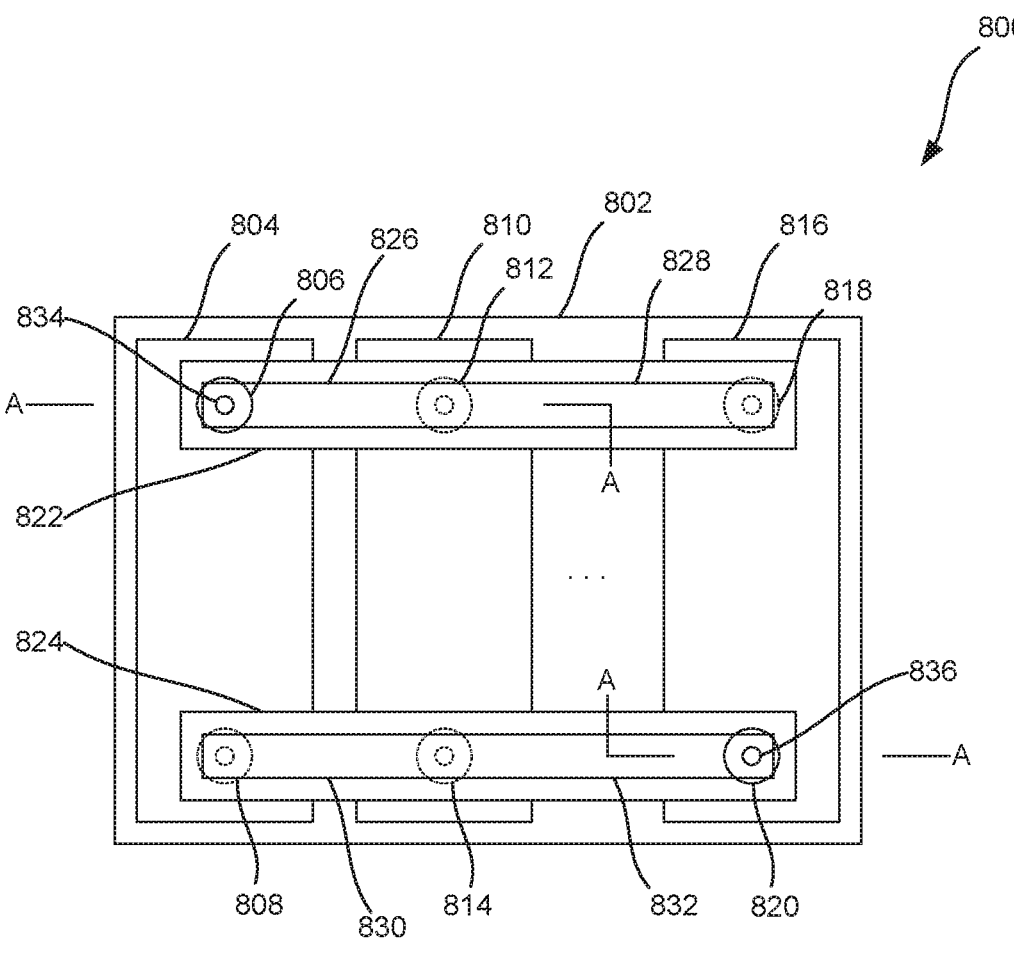
FIG. 39 is a top view of a schematic block diagram of an additional embodiment of a dual-port-matched band pass filter-based multiband filter of the present invention in a side-to-side configuration.

Embodiments of the DPMBPF of the present invention may allow for various configurations of a multiband filter. FIGS. 39 and 40 illustrate an embodiment of a configuration of a multiband filter 800. In this embodiment, filter 800 includes a first DPMBPF 804, a second DPMBPF 810 and a third DPMBPF 816 affixed to a surface of a carrier printed circuit board (PCB) 802 in a side-by-side configuration. DPMBPFs 804, 810, 816 are configured in a similar configuration as DPMBPF 500 discussed above, e.g. each having a main part, along with a first and a second port-matching part. Further, each include a first port 806, 812, 818 and a second port 808, 814, 820.

In this embodiment, due to the DPMBPFs 804, 810, 816 having impedance matching capabilities, the DPMBPFs may be connected by short transmission lines 826, 828, 830, 832. In this embodiment, transmission lines 826, 828, 830, 832 are designed within a substrate 822, 824 such as a low-temperature co-fired ceramic (LTCC) board or a printed circuit board (PCB), with transmission lines 826, 828 being connected to first ports 806, 812, 818 and transmission lines 830, 832 being connected to second ports 808, 814, 820. Further, in this embodiment, first port 806 and second port 820 extend through the substrates 822, 824 creating common input/output ports 834, 836.

In this embodiment, the configuration includes three DPMBPFs 804, 810, 816. This is illustrative. As illustrated in FIG. 39, there may be N number of DPMBPFs arranged in a side-by-side configuration to allow for the inclusion of a multiple of DPMBPFs depending on the design criteria, and other needs, of the multiband filter 800.

Abbreviations that may be used in the preceding description include:

| Abbreviation | Explanation |
| --- | --- |
| CWG | Ceramic Waveguide |
| FDD | Frequency Division Duplex |
| BPF | Bandpass Filter |
| SPMBPF | Single-Port-Matched Bandpass Filter |
| DPMBPF | Dual-Port-Matched Bandpass Filter |
| LTCC | Low Temperature Co-Fired Ceramics |

Many different embodiments have been disclosed herein, in connection with the above description and the drawings. It will be understood that it would be unduly repetitious and obfuscating to literally describe and illustrate every combination and sub-combination of these embodiments. Accordingly, all embodiments can be combined in any way and/or combination, and the present specification, including the drawings, shall be construed to constitute a complete written description of all combinations and sub-combinations of the embodiments described herein, and of the manner and process of making and using them, and shall support claims to any such combination or sub-combination.

It will be appreciated by persons skilled in the art that the embodiments described herein are not limited to what has been particularly shown and described herein above. In addition, unless mention was made above to the contrary, it should be noted that all the accompanying drawings are not to scale. A variety of modifications and variations are possible in light of the above teachings without departing from the scope of the following claims.

What is claimed is:

1. A duplexer comprising:
i) a transmit single-port-matched band pass filter (TX SPMBPF) comprising:
ia) a transmit (TX) main part, the TX main part comprising a TX first port in signal communication with a transmit port, the TX first port configured to receive a transmit radio frequency (RF) signal from the transmit port, the TX main part configured to filter the transmit RF signal; and
ib) a TX port-matching part coupled to and in signal communication with the TX main part, the TX port-matching part including an TX second port, the TX second port is used as an antenna port of the duplexer and in signal communication with an antenna;
ii) an RF transmission line component connected to the TX second port; and
iii) a receive single-port-matched band pass filter (RX SPMBPF) comprising:
iiia) a receive (RX) main part, the RX main part comprising an RX first port in signal communication with a receive port; and iiib) an RX port-matching part coupled to and in signal communication with the RX main part, the RX port-matching part including an RX second port connected to the RF transmission line component providing signal communication to the antenna port, the RX port-matching part being configured to receive an RF signal from the antenna port, wherein the RX main part is configured to filter the received RF signal and provide the filtered received RF signal to the receive port through the RX first port,
the TX port-matching part configured to provide impedance matching in its RX band to match the connected RX SPMBPF and the antenna at the antenna port, and
the RX port-matching part configured to provide impedance matching in its TX band to match the connected TX SPMBPF and the antenna at the antenna port.

2. The duplexer of claim 1, wherein the impedance matching provided by the TX port-matching part is further defined as a high impedance in the RX band of the TX SPMBPF.

3. The duplexer of claim 1, wherein the impedance matching provided by the RX port-matching part is further defined as a high impedance in the TX band of the RX SPMBPF.

4. The duplexer of claim 1, wherein the TX port-matching part and TX main part are constructed together using the same materials and manufacture process.

5. The duplexer of claim 1, wherein the RX port-matching part and RX main part are constructed using the same materials and manufacture process.

6. The duplexer of claim 1, wherein the RX SPMBPF is attached adjacent to the TX SPMBPF in a stacked configuration.

7. The duplexer of claim 1, wherein the RX SPMBPF is attached adjacent to the TX SPMBPF in a stacked configuration where the TX second port and RX second port are aligned to create a second common input/output port.

8. The duplexer of claim 1, wherein the RF transmission line component is located within a substrate.

9. A multiplexer comprising:
i) one or more transmit single-port-matched band pass filters (TX SPMBPFs), each TX SPMBPF comprising:
ia) a transmit (TX) main part, the TX main part including a TX first port in signal communication with a transmit port, the TX first port configured to receive a transmit radio frequency (RF) signal from the transmit port, the TX main part configured to filter the transmit RF signal; and
ib) a TX port-matching part, the TX port-matching part coupled to and in signal communication with the TX main part, the TX port-matching part including an TX second port being configured in signal communication with an antenna, wherein one of the TX second ports of the one or more TX SPMBPFs is set as an antenna port;
ii) a plurality of RF transmission line components connected to the TX second ports; and
iii) one or more receive single-port-matched band pass filters (RX SPMBPFs), each RX SPMBPF comprising:
iiia) a receive (RX) main part, the RX main part including an RX first port in signal communication with a receive port; and
iiib) an RX port-matching part, the RX port-matching part coupled to and in signal communication with the RX main part, the RX port-matching part including an RX second port, the RX second port connected to at least one of the plurality of RF transmission line components and providing signal communication to the antenna port, the RX port-matching part configured to receive an RF signal from the antenna port, wherein the RX main part configured to filter the received RF signal and provide the filtered received RF signal to the receive port through the RX first port, the RX port-matching part configured to provide impedance matching in all pass bands of its connected TX SPMBPFs and other RX SPMBPFs to match all the connected TX and other RX SPMBPFs and the antenna at the antenna port, and each of the TX port-matching parts configured to provide impedance matching in all pass bands of its connected other TX SPMBPFs and RX SPMBPFs to match all the connected other TX SPMBPFs and RX SPMBPFs and the antenna at the antenna port.

10. The multiplexer of claim 9, wherein the impedance matching provided by each of the RX port-matching parts is further defined as a high impedance in all pass bands of its connected TX SPMBPFs and other RX SPMBPFs for its own RX SPMBPF.

11. The multiplexer of claim 9, wherein each of the TX port-matching parts and TX main parts are constructed using the same materials and manufacture process.

12. The multiplexer of claim 9, wherein each of the RX port-matching parts and RX main parts are constructed together using the same materials and manufacture process.

13. The multiplexer of claim 9, wherein the one or more RX SPMBPFs are attached adjacent to the one or more TX SPMBPFs in a stacked configuration.

14. The multiplexer of claim 9, wherein the one or more RX SPMBPFs are attached adjacent to the one or more TX SPMBPFs in a stacked configuration where the TX second ports and the RX second ports are aligned to create a second common input/output port.

15. The multiplexer of claim 9, wherein the one or more TX SPMBPFs are attached adjacent to the one or more RX SPMBPFs in a side-to-side configuration.

16. The multiplexer of claim 9, wherein the one or more TX SPMBPFs and the one or more the RX SPMBPFs are attached in a side-to-side configuration where the TX second ports and the RX second ports are aligned to create a second common input/output port.

17. The multiplexer of claim 9, wherein one or more of the plurality of RF transmission line components are located within a substrate.

18. The multiplexer of claim 9, wherein the impedance matching provided by each of the TX port-matching parts is further defined as a high impedance in all pass bands of its connected other TX SPMBPFs and RX SPMBPFs for its own TX SPMBPF.

* * * * *